(12) United States Patent
Yamazaki et al.

(10) Patent No.: US 6,614,083 B1
(45) Date of Patent: Sep. 2, 2003

(54) WIRING MATERIAL AND A SEMICONDUCTOR DEVICE HAVING WIRING USING THE MATERIAL, AND THE MANUFACTURING METHOD

(75) Inventors: Shunpei Yamazaki, Tokyo (JP); Toru Takayama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/527,437

(22) Filed: Mar. 16, 2000

(30) Foreign Application Priority Data

Mar. 17, 1999 (JP) .......................................... 11-072818

(51) Int. Cl.⁷ ............................................. H01L 29/76
(52) U.S. Cl. ...................... 257/412; 257/486; 257/750; 257/757; 257/763
(58) Field of Search ................................ 257/412, 486, 257/750, 757, 763

(56) References Cited

U.S. PATENT DOCUMENTS

| | | | |
|---|---|---|---|
| 5,594,569 A | 1/1997 | Konuma et al. | ............. 349/122 |
| 5,643,826 A | 7/1997 | Ohtani et al. | ................. 437/88 |
| 5,738,948 A | 4/1998 | Ikeda et al. | ................. 428/663 |
| 5,913,100 A | 6/1999 | Kohsaka et al. | ............. 428/546 |
| 5,923,962 A | 7/1999 | Ohtani et al. | ............... 438/150 |
| 6,088,070 A | 7/2000 | Ohtani et al. | ................. 349/38 |
| 6,303,483 B1 * | 10/2001 | Kunikiyo | |
| 6,313,481 B1 | 11/2001 | Ohtani et al. | ................. 257/59 |

FOREIGN PATENT DOCUMENTS

| EP | 947 593 A2 | 10/1999 |
|---|---|---|
| JP | 5-0932697 | 4/1993 |
| JP | 5-263226 | 10/1993 |
| JP | 7-076771 | 3/1995 |
| JP | 7-130652 | 5/1995 |
| JP | 8-153722 | 6/1996 |
| JP | 735 152 A1 | 10/1996 |
| JP | 11-133463 | 5/1997 |
| JP | 11-133463 | 8/1998 |
| JP | 10-247735 | 9/1998 |
| JP | 2001-056485 | 2/2001 |
| WO | WO 95/16797 | 6/1995 |

OTHER PUBLICATIONS

English Abstract re Japanese Patent Application No. JP 11–133463 published Aug. 7, 1998.
English Abstract re Japanese Patent Application No. JP 2001–056485 published Feb. 27, 2001.
Yoshida, T. et al, "A Full–Color Thresholdless Antiferroelectric LCD Exhibiting Wide Viewing Angle with Fast Response Time," SID 97 Digest, pp. 841–844, 1997.
Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.
English abstract re Japanese patent application No. 5–093267, published Apr. 16, 1993.
English abstract re Japanexe patent application No. 5–263226 published Oct. 12, 1993
English abstract re Japanese patent application No. 7–076771 published Mar. 20, 1995.
English abstract re Japanese patent application No. 7–130652, published May 19, 1995.

(List continued on next page.)

*Primary Examiner*—Fetsum Abraham
(74) *Attorney, Agent, or Firm*—Cook, Alex, McFarron, Manzo, Cummings & Mehler, Ltd.

(57) ABSTRACT

An object of the present invention is to realize a semiconductor device having a high TFT characteristic. In manufacturing an active matrix display device, electric resistivity of the electrode material is kept low by preventing penetration of oxygen ion into the electrode in doping of an impurity ion. A display device having a low electric resistivity can be obtained.

37 Claims, 24 Drawing Sheets

OTHER PUBLICATIONS

English abstract re WO patent application No. 95/16797 published Jun. 22, 1995.

English abstract re Japanese patent application No. 8-153722 published Jun. 11, 1996.

English abstract re Japanese patent application No. 10-247735, published Sep. 14, 1998.

English abstract re Japanese patent application No. 11-133463, published Oct. 6, 1999.

* cited by examiner

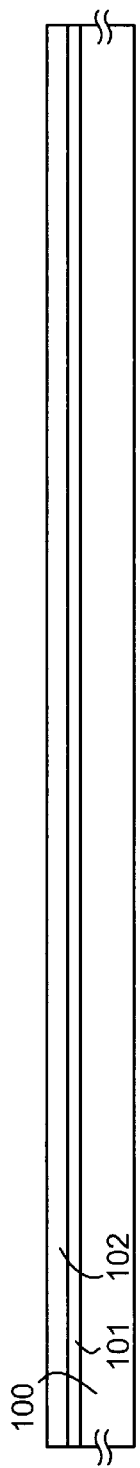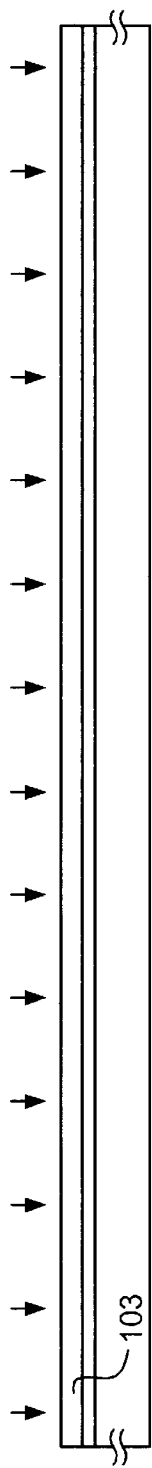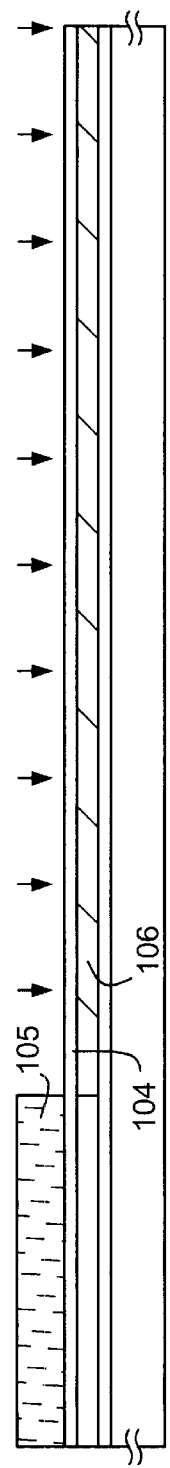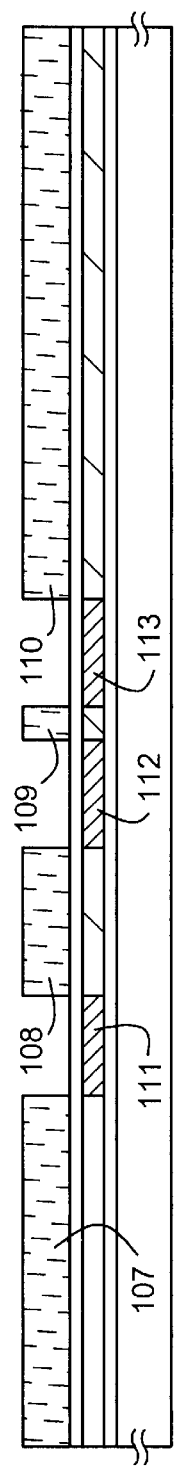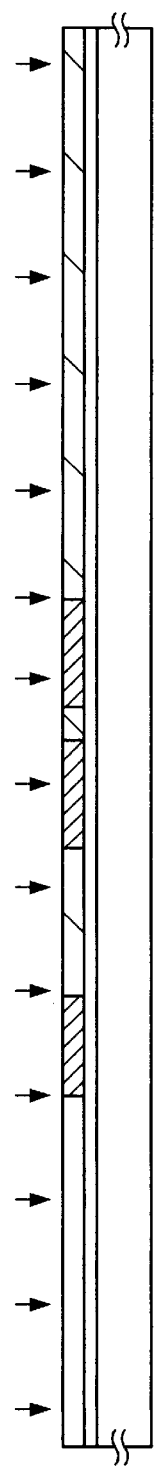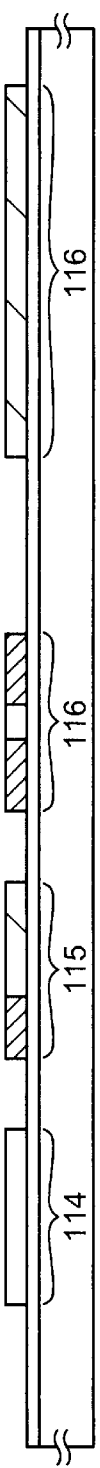

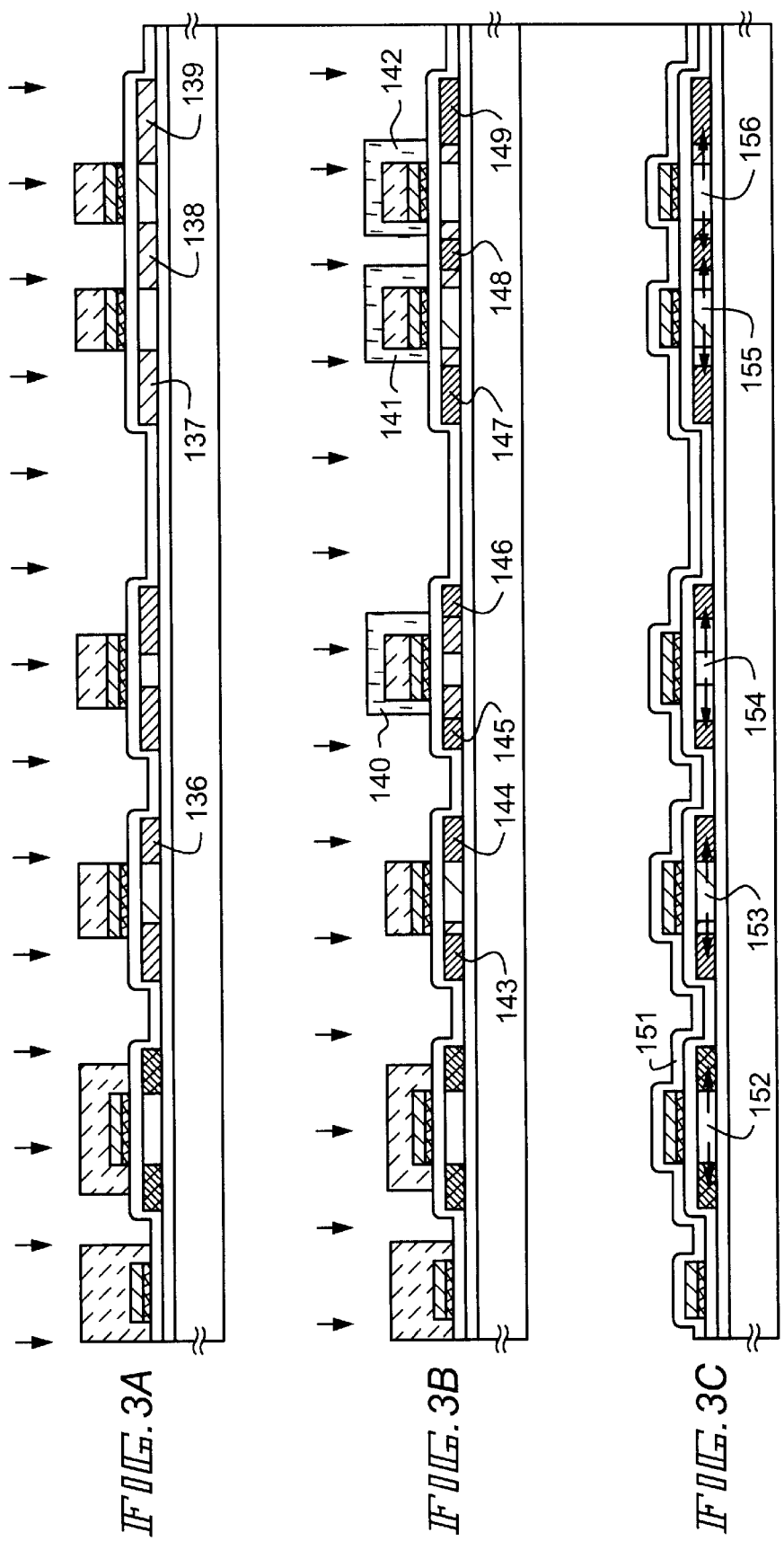

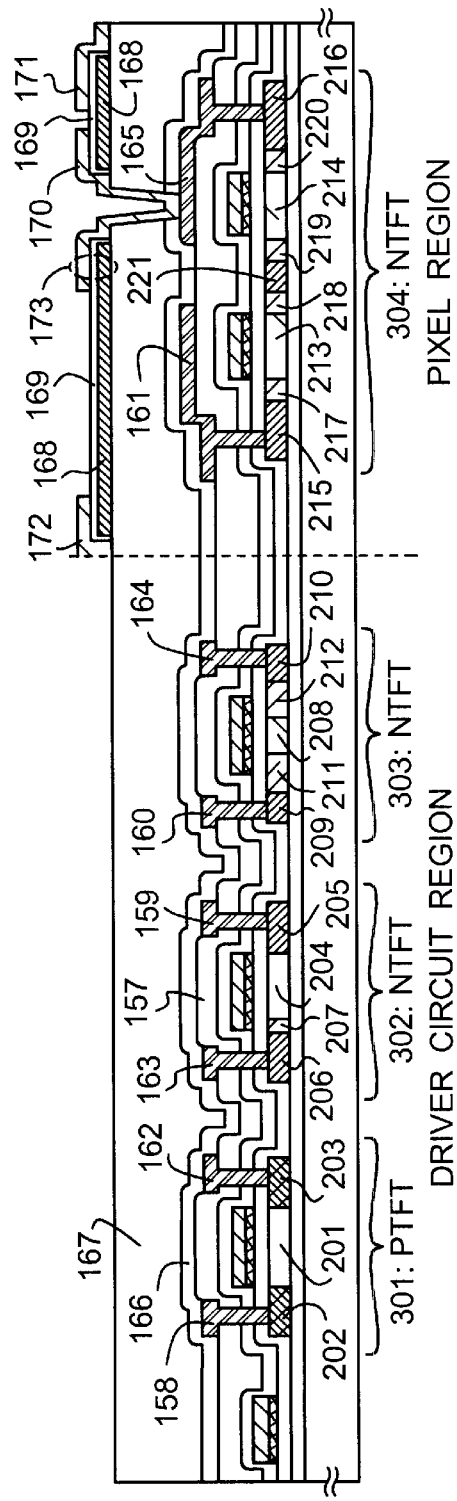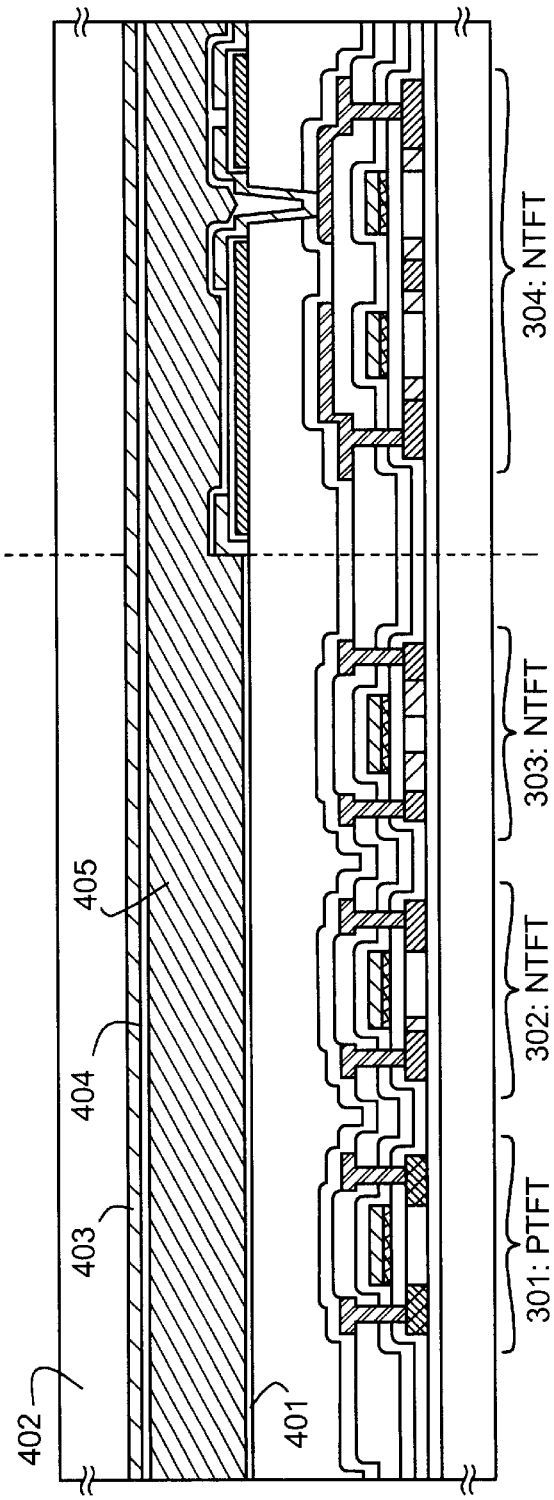
FIG. 4A
FIG. 4B

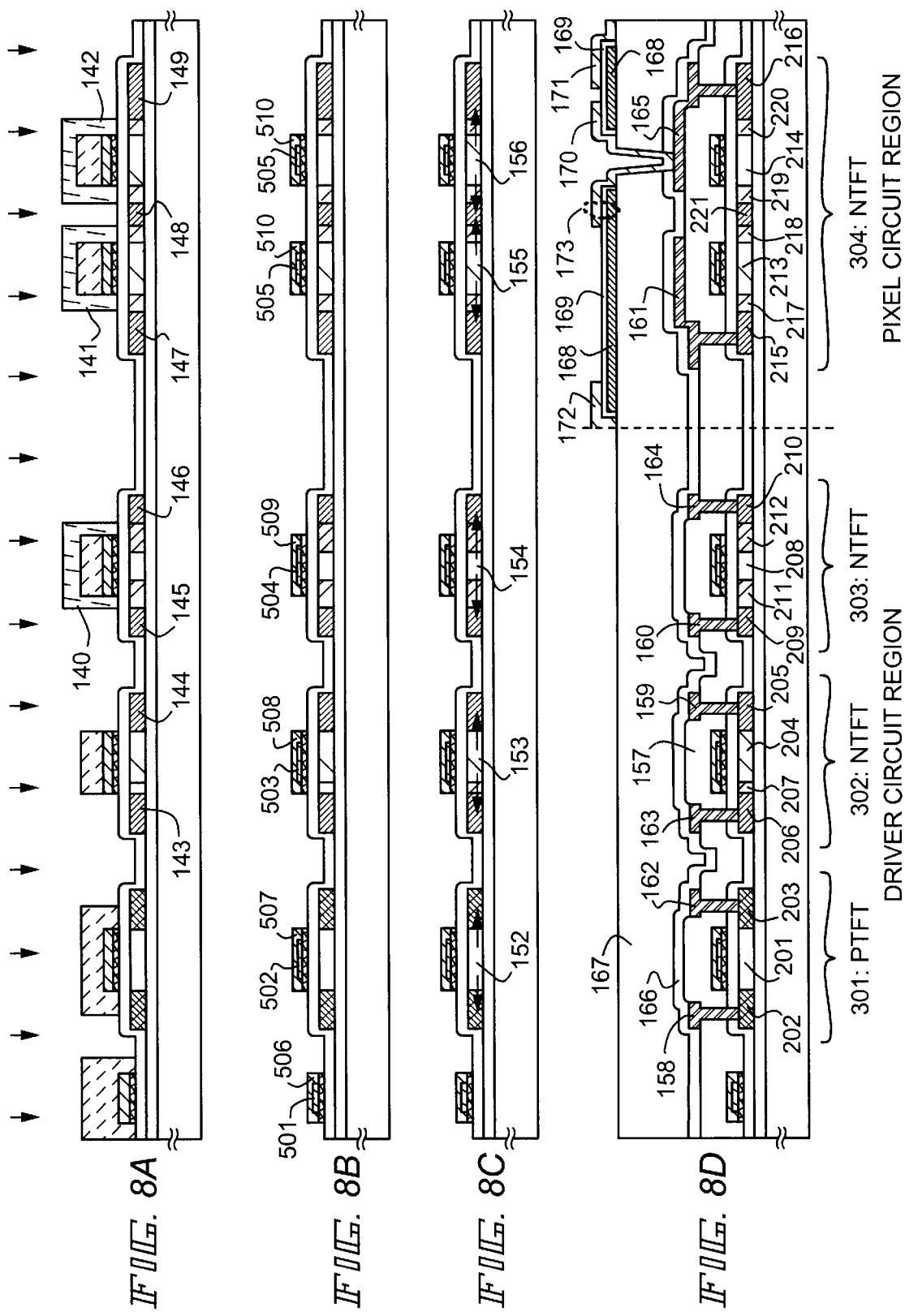

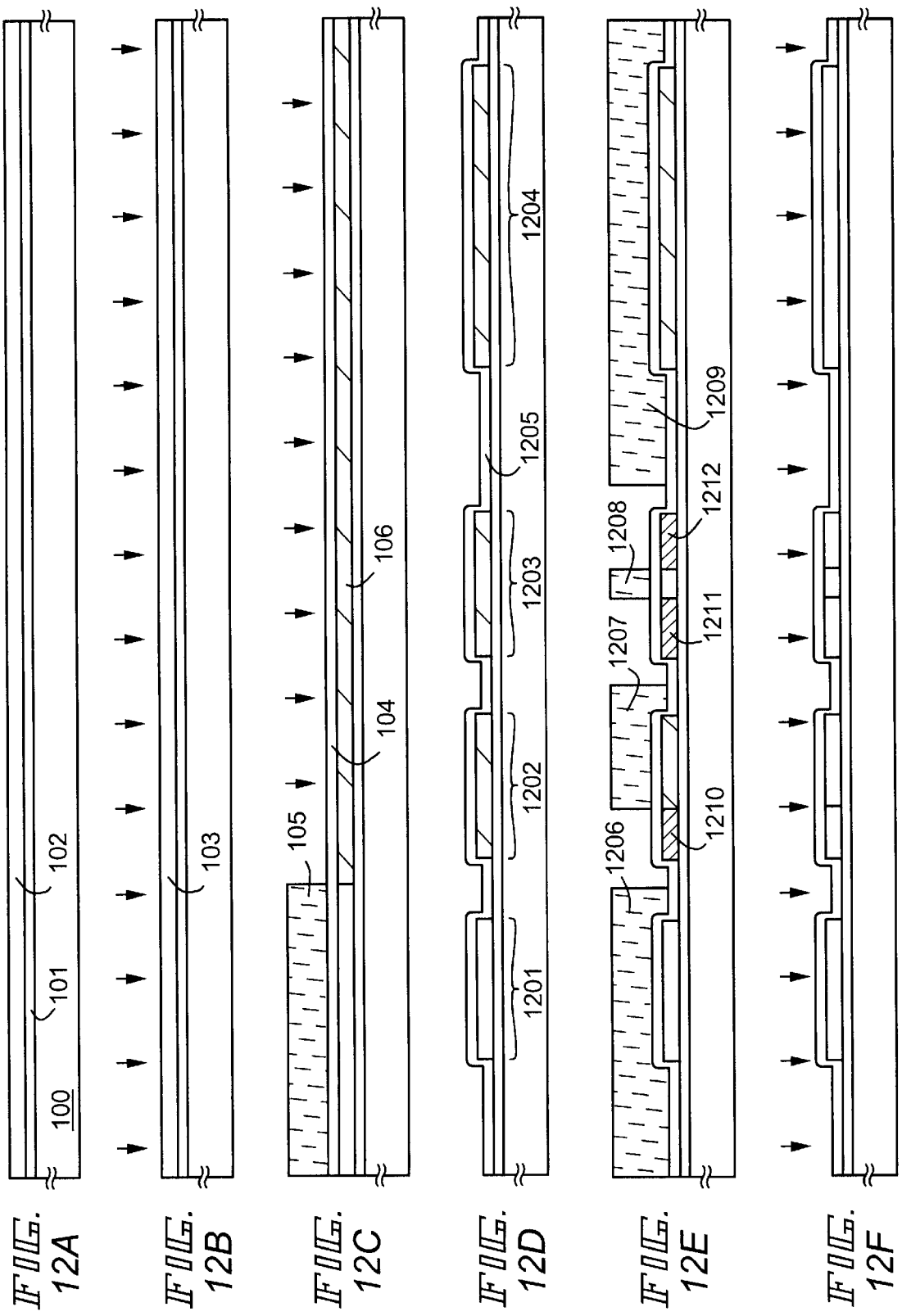

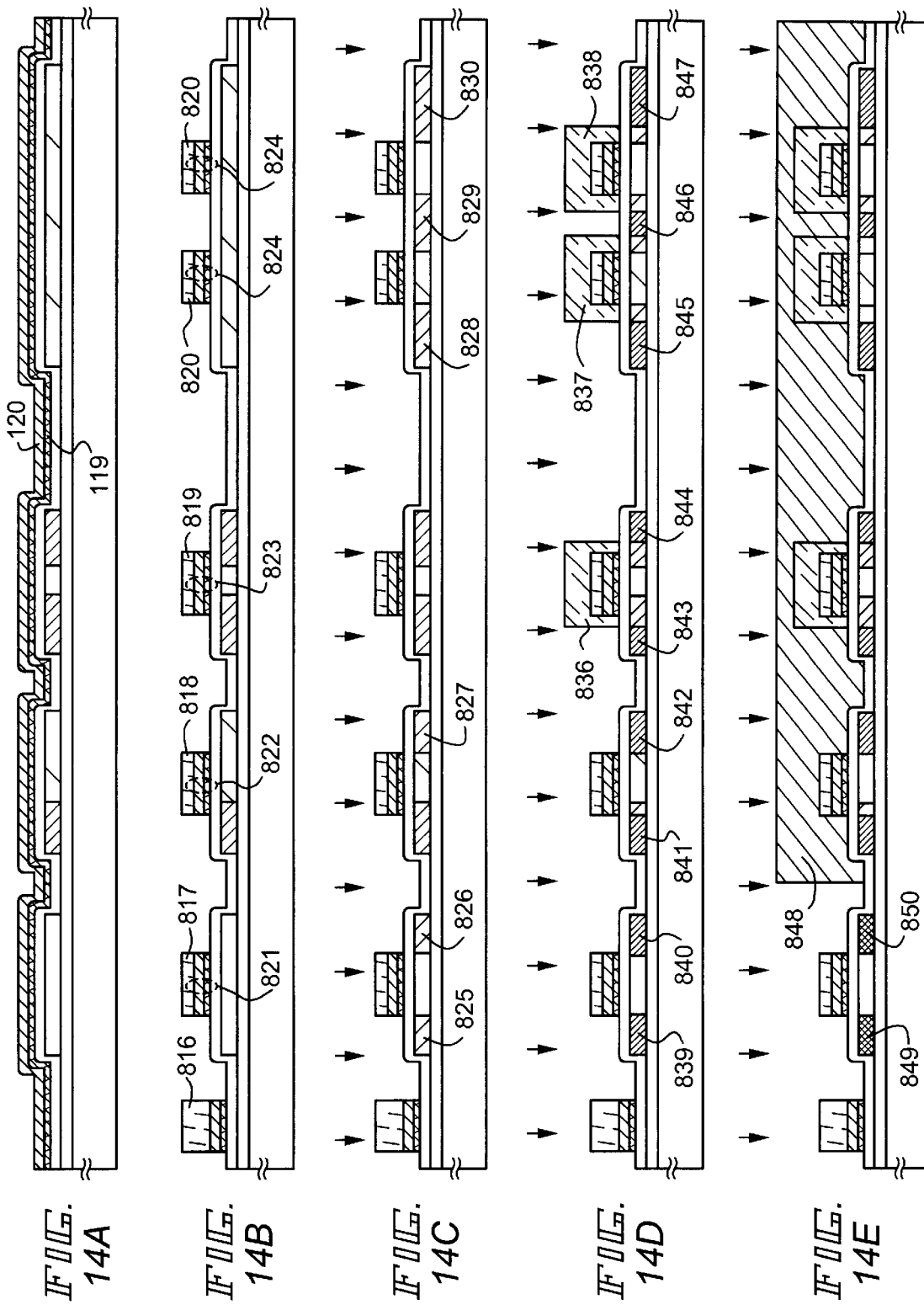

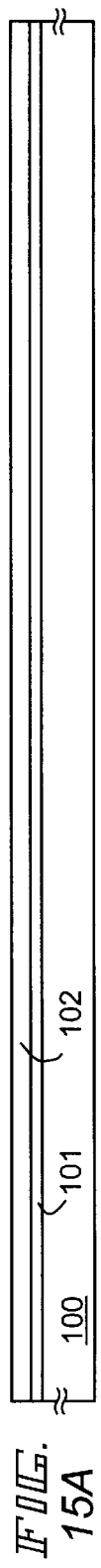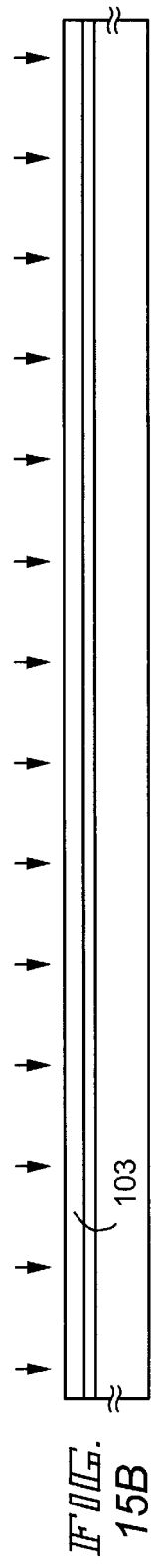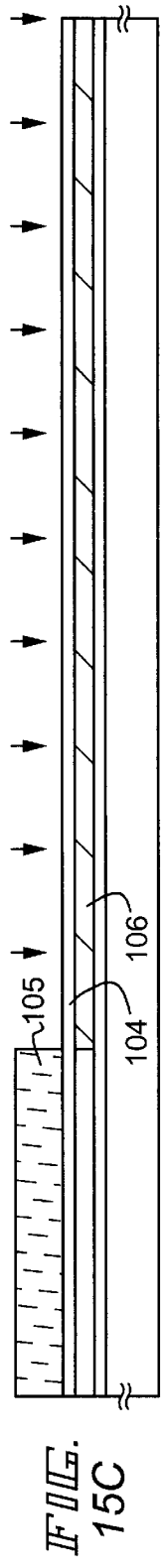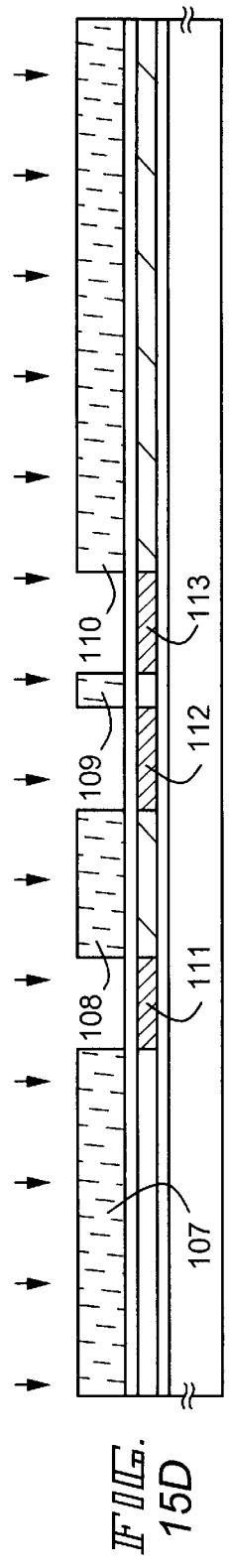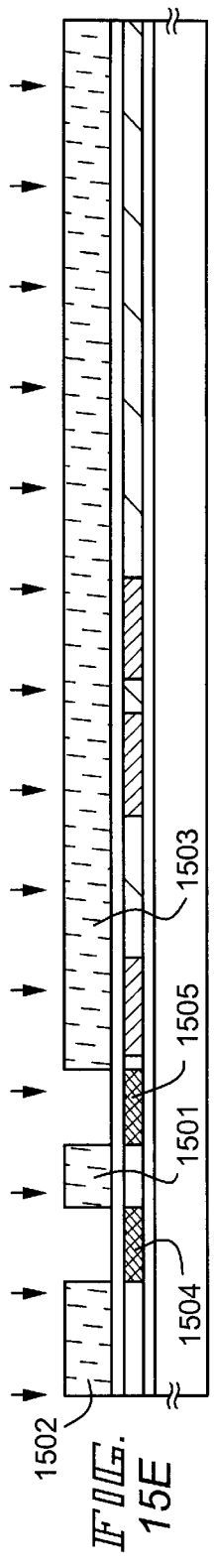
FIG. 15A
FIG. 15B
FIG. 15C
FIG. 15D
FIG. 15E

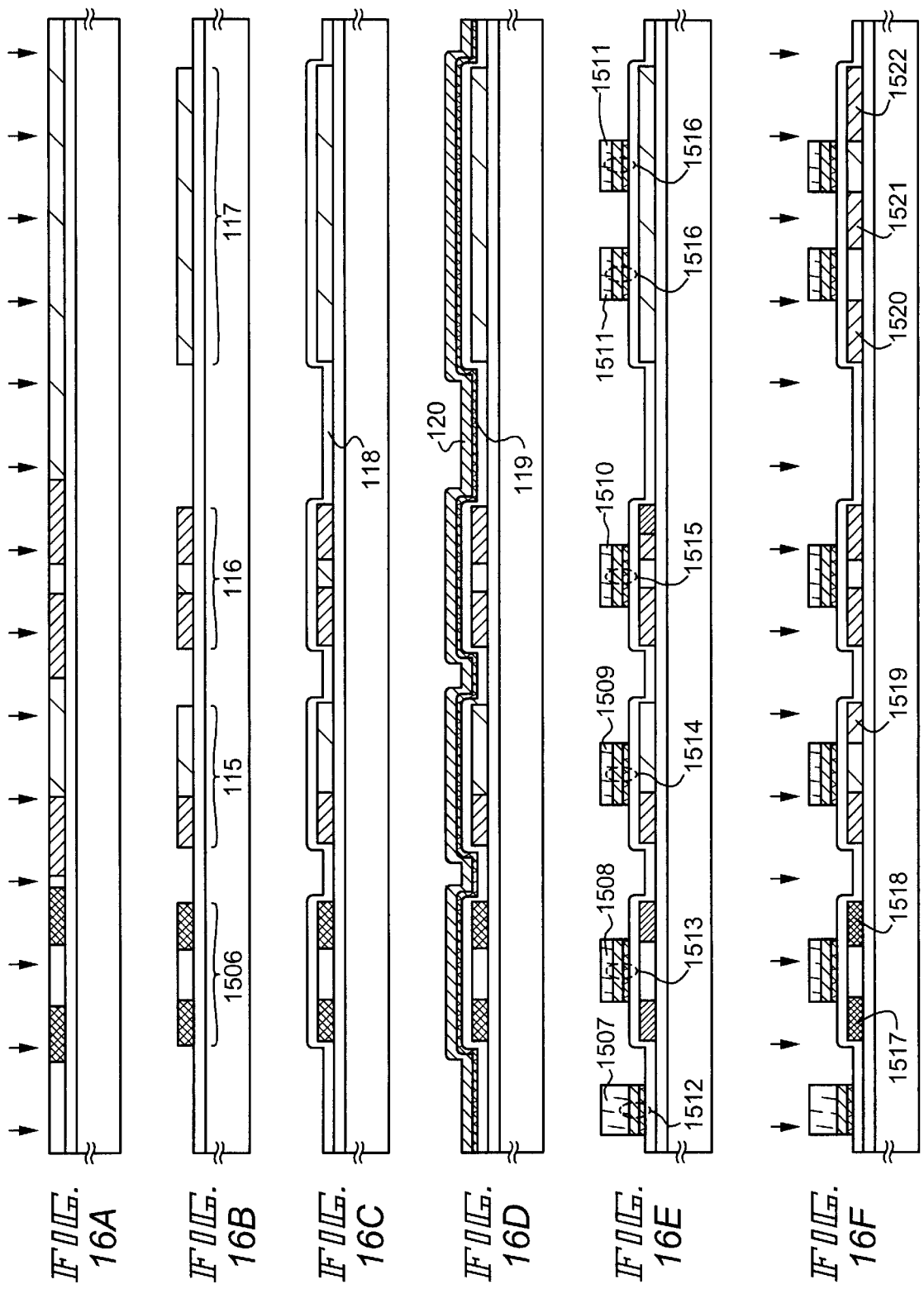

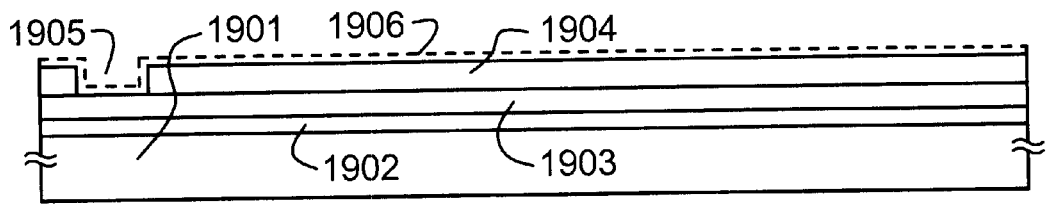
FIG. 19A
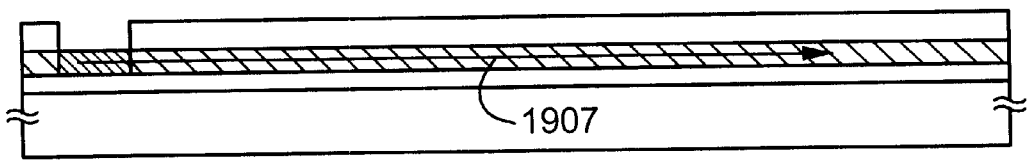
FIG. 19B
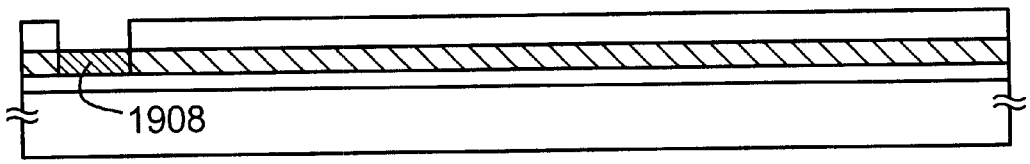
FIG. 19C
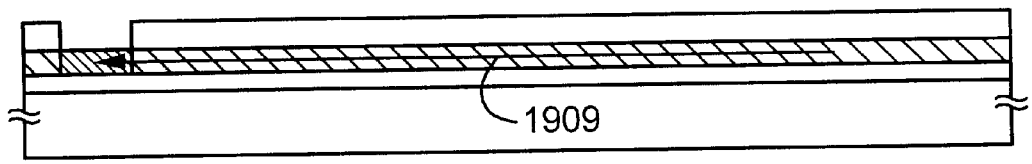
FIG. 19D

WIRING MATERIAL AND A SEMICONDUCTOR DEVICE HAVING WIRING USING THE MATERIAL, AND THE MANUFACTURING METHOD

BACKGROUND OF THE INVENTION

1. Field of the Invention

The present invention relates to a semiconductor device having a circuit comprising a thin film transistor (hereinafter referred to as TFT). For example, the present invention relates to an electro-optical device, typically a liquid crystal display device, and an electronic device with an electro-optical device installed as a component.

Note that through this specification, a semiconductor device indicates general devices that can function by using semiconductor characteristics, and that electro-optical devices, semiconductor circuits, and electronic devices are all categorized as semiconductor devices.

2. Description of the Related Art

Techniques for using semiconductor thin films (with a thickness on the order of several nm to several hundreds of nm) formed on a substrate having an insulating surface to structure a thin film transistor (TFT) have been in the spotlight in recent years. Thin film transistors are widely applied to electronic devices such as ICs and electro-optical devices, and the rapid development thereof as switching elements for image display devices is desired.

For example, the application of TFTs is being attempted in every electric circuit in a liquid crystal display device, such as pixel matrix circuits that control each of the pixels, arranged in a matrix shape, driver circuits that control the pixel matrix circuits, and in addition, logic circuits (such as processor circuits and memory circuits) which process external data signals; in all electric circuits.

Conducting materials such as Al, Ta, and Ti are conventionally used as wiring materials for the above TFT, and among them aluminum that have low resistivity is often used. However, when a TFT is manufactured by using aluminum as a wiring material, operation error or deterioration of TFT characteristics were caused by formation of projections such as hillocks or whiskers or by dissemination of aluminum atoms into the channel forming region, in the heat treatment.

SUMMARY OF THE INVENTION

As stated above, aluminum is not a preferable wiring material in the TFT manufacturing process because of its low heat resistance.

The present invention was brought forth considering such problem. It is an object of the present invention to provide an electrooptical device having high reliability by using a material that has efficiently low electric resistivity and is highly heat resistant for a wiring or an electrode of the circuits in the electrooptical device characterized by AM-LCD, and a manufacturing process therefor.

In order to solve the above stated objects, the present invention uses a target comprising highly purified high melting point metal, and provides a high melting point metal film obtained by sputtering for the wiring material. Specifically, the use of tungsten (W) as the high melting point metal is one of the characteristics of the present invention. In addition, as other high melting point metals., molybdenum (Mo), tantalum (Ta), chromium (Cr), niobium (Nb) or vanadium (V) may be used. Further, a eutectic alloy (molybdenum-tantalum alloy) with such other high melting point metals (molybdenum etc.) may be used.

A material of purity higher than 4N is used for the target, and a simple substance gas such as argon (Ar), krypton (Kr) or xenon (Xe), or a mixed gas of those gases may be used as the sputtering gas. In case of using simple substance gas of argon, it is preferable to prevent mixing of impurity element. Conditions such as sputtering power, gas pressure, or substrate temperature may be suitably controlled by the operator.

A high melting point metal film (tungsten) obtained as such includes scarce impurity elements, typically, amount of oxygen included could be reduced to no more than 30 parts per million (ppm), and an electric resistivity of 20 mW cm or less, typically 6–15 mW cm could be obtained. The stress of the film was $-5 \times 10^9 - 5 \times 10^9$ dyn/cm$^2$.

Further, the use of laminate structure of a high melting point metal film and a nitride of a high melting point metal film for the wiring of the semiconductor device is another characteristic of the present invention. For example, tungsten (W) is laminated on tungsten nitride (WNx (0<x<1)) after the tungsten nitride is formed on an insulating surface. A silicon film having conductivity (e.g. phosphorus doped silicon film, boron doped silicon film) may be disposed under the tungsten nitride (WNx) for improving close adhesion. The wiring can be formed at width of 5 μm or less, and the film thickness of 0.1–0.7 μm.

High melting point metals are not resistant against oxidation in general, and they are easily oxidized in a heat treatment in an atmosphere in the existence of remaining oxygen of few ppm. As a result, increase in the electric resistiity and film peeling may occur. Further, introduction of trace impurity element contained in the reactive gas into the high melting point metal at ion doping, such as oxygen may also increase the electric resistivity.

Therefore, the manufacturing method of TFT of the present invention is characterized by covering the surface of the high melting point metal with a nitride film by nitride treatment such as heat nitrification or plasma nitrification etc., before treating the substrate on which said high melting point metal films are disposed with heat. When a wiring having under layer of tungsten nitride (WNx) and upper layer of tungsten (W) is nitrided, the wiring may be in a structure in which tungsten film is covered by tungsten nitride (WNx) on the upper surface, the side face and the under surface.

When heat treatment is carried out after forming a passivation film comprising silicon nitride film or silicon nitride oxide film etc. in order to prevent oxidation, pin holes were generated and in some cases oxidation advanced into the tungsten film.

FIG. 25 shows a result of measuring the number of pin holes by surface inspecting apparatus (manufactured by Hitachi, GI-4600) per 100 mm$^2$ of a laminated films comprising under layer WNx (film thickness 30 nm) and upper layer W (thickness 120 nm) formed over a quartz substrate (127 mm×127 mm) after treating under conditions 1 through 4 shown below: Condition 1) After plasma nitrification treatment using ammonia gas and formation of silicon nitride film (film thickness 25 nm), heat treatment (550° C., 4 hours) Condition 2) After formation of silicon nitride film (thickness 25 nm), heat treatment (550° C., 4 hours)

Condition 3) After forming silicon nitride film (thickness 25 nm), silicon nitride oxide film is formed (thickness 200 nm) and heat treatment (550° C., 4 hours) Condition 4) silicon nitride oxide film is formed (thickness 200 nm) and heat treatment (550° C., 4 hours)

Conditions of film formation of WNx and W are shown in Table 1.

TABLE 1

|  | WN sputtering condition | W sputtering condition |
|---|---|---|
| Target | φ 6 inch W 99.95% | <= |
| Temperature (° C.) | R.T. | <= |
| Sputtering pressure (Pa) | 0.4 | <= |
| Ar flow (sccm) | 20 | 50 |
| $N_2$ flow (sccm) | 10 | (None) |
| Sputtering current (A) | 4 | <= |
| T-S (mm) | Approx. 98 | <= |

Conditions of above stated plasma treatment and conditions of film formation of above stated silicon nitride film and silicon nitride oxide film $SiO_xN_y$ (0<x, y<1) are shown in Table 2.

TABLE 2

| Items | Plasma treatment | SiN deposition | SiON deposition |
|---|---|---|---|
| Temperature (° C.) | 325 | <= | <= |
| Treatment pressure (Torr) | 0.7 | <= | 1.2 |
| $SiH_4$ flow (sccm) | — | 5 | 27 |
| $NH_3$ flow (sccm) | 38 | 38 | 900 |
| $N_2$ flow (sccm) | — | 87 | — |
| RF electric power (W) | 300 | 300 | 50 |
| Gap (mm) | 34 | 34 | 20 |

It was confirmed that the number of pinholes were remarkably decreased by plasma nitrification process using ammonia gas from FIG. 25.

Further, it is another characteristic of the manufacturing process for TFT of the present invention to prevent introduction of impurity ion, specifically oxygen, ion into the wiring by covering at least the upper surface of the gate electrode with a mask when conducting ion doping for forming impurity regions. This mask may be a mask comprising a photo-sensitive resin of a resist etc. exposed to light by using a photo mask, or it may be a mask comprising silicon as a main component that is patterned by using a resist mask etc. Provided, it is necessary that this mask has a sufficient film thickness to prevent introduction of oxygen ion etc. into the gate electrode.

According to the structure of the invention disclosed in the specification, a semiconductor device that has at least a pixel matrix circuit and driver circuit on a same substrate is characterized by:

at least a portion or the entire of the LDD region of n-channel TFT that forms said driver circuit is disposed so as to overlap with the gate wiring of the n-channel TFT;

the LDD region of n-channel TFT that forms said driver circuit includes an impurity element imparting n-type at a higher concentration than the LDD region of the pixel TFT that structures pixel matrix circuit;

the gate wiring has a first gate wiring formed in contact with an insulating film, a second gate wiring formed inside of the first gate wiring and in contact with the first gate wiring and a third gate wiring formed in contact with the first gate wiring and the second gate wiring.

Further, according to another structure of the present invention a semiconductor device that has at least a pixel matrix circuit and driver circuit on a same substrate is characterized by:

at least a portion or the entire of the LDD region of n-channel TFT that forms said driver circuit is disposed so as to overlap with the gate wiring of the n-channel TFT;

the LDD region of the pixel TFT that forms the pixel matrix circuit is disposed so as not to overlap with the gate wiring of the pixel TFT;

the LDD region of n-channel TFT that forms said driver circuit includes an impurity element imparting n-type at a higher concentration than the LDD region of the pixel TFT that structures pixel matrix circuit;

the gate wiring has a first gate wiring formed in contact with an insulating film, a second gate wiring formed inside of the first gate wiring and in contact with the first gate wiring and a third gate wiring formed in contact with the first gate wiring and the second gate wiring.

Still further, it is characterized that:

the first gate wiring comprises a material whose main component is a tungsten nitride layer;

the second gate wiring comprises a material whose main component is a tungsten layer; and the third gate wiring comprises a material whose main component is a nitride layer formed by nitriding the second gate wiring;

in each of the above stated structures.

According to still another structure of the present invention, the manufacturing method for semiconductor device that includes at least a pixel matrix circuit and a driver circuit, is characterized by comprising the steps of:

forming an active layer over a substrate;

forming a gate insulating film in contact with the active layer;

forming a gate wiring whose main component is tungsten over the gate insulating film; and forming an impurity region by adding impurity elements in a self-alignment manner by using the gate wiring as a mask, wherein said process of forming the impurity region uses a mask that has a mask on at least upper surface of the gate electrode.

According to still another structure of the present invention the manufacturing method for semiconductor device that includes at least a pixel matrix circuit and a driver circuit, is characterized by comprising the steps of:

forming an active layer over a substrate;

forming a gate insulating film in contact with the active layer;

forming a gate wiring whose main component is tungsten over the gate insulating film;

forming an impurity region by adding impurity elements in a self-alignment manner by using the gate wiring as a mask; and forming a nitride film on the surface of the gate wiring by treating the gate electrode with a nitrification process.

Further, the nitrification process is characterized by carried out by generating plasma in an ammonium gas atmosphere.

Still further, in each of the structures, the gate wiring is characterized by a laminate structure comprising a tungsten film and a tungsten nitride film.

Still further, in each of the structures, the gate wiring is characterized as formed by sputtering.

In the present specification, "electrode" is a portion of "wiring" and denotes an area where a wiring electrically connects with other wirings, or it intersects with a semiconductor layer. Therefore, though "wiring" and "electrode" are used properly by cases for the convenience of explanation, meaning of "electrode" is considered to always include "wiring".

BRIEF DESCRIPTION OF THE DRAWINGS

In the accompanying drawings:

FIG. 1 shows a manufacturing method of AM-LCD.

FIG. 3 shows a manufacturing method of AM-LCD.

FIG. 4 shows a manufacturing method of AM-LCD.

FIG. 8 shows a manufacturing method of AM-LCD.

FIG. 12 shows a manufacturing method of AM-LCD.

FIG. 14 shows a manufacturing method of AM-LCD.

FIG. 15 shows a manufacturing method of AM-LCD.

FIG. 16 shows a manufacturing method of AM-LCD.

FIG. 19 is a diagram showing a cross section showing manufacturing process of crystalline semiconductor film.

DETAILED DESCRIPTION OF THE PREFERRED EMBODIMENTS

Embodiment Mode

Figure 2A:
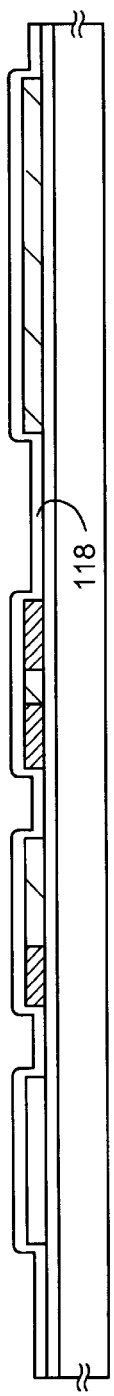
FIG. 2 shows a manufacturing method of AM-LCD.

The embodiment mode of the present invention is explained in detail by the

Embodiments shown below.

Embodiments

Embodiment 1

An embodiment of the present invention is explained by referring to FIGS. 1–5. Here, a manufacturing method for fabricating TFTs of pixel circuit and driver circuit disposed in the periphery at the same time is explained. Provided, for the simplicity of the explanation, CMOS circuits that are base circuits of shift register circuit, buffer circuit, etc., and n-channel TFT that forms sampling circuit are shown for the control circuit.

In FIG. 1(A), a glass substrate or a quartz substrate is preferably used as a substrate 100. A silicon substrate or a metal substrate having an insulating film on the surface thereof can be used, too. If heat resistivity permits plastic substrate may also be used.

A base film 101 that comprises a silicon-containing insulating film (the term "insulating film" generically represents a silicon oxide film, a silicon nitride film and a silicon nitride oxide film in this specification) is formed by plasma CVD or sputtering to a thickness of 100 to 400 nm on the surface of the substrate 100 on which the TFTs are to be fabricated. The term "silicon nitride oxide film" used in this specification represents an insulating film expressed by the general formula $SiO_xN_y$ (where $0<x$ and $y<1$) and containing silicon, oxygen and nitrogen in a predetermined proportion. A silicon nitride oxide film may be fabricated from raw material gas of $SiH_4$, $N_2O$ and $NH_3$, and may contain nitrogen at a concentration from 25 atomic % and below 50 atomic %.

In this example, the base film 101 has a two-layered structure consisting of a silicon nitride oxide film of 25–100 nm, here at 50 nm, and a silicon oxide film of 50–300 nm, here at 150 nm. The base film 101 is disposed so as to prevent contamination of impurities from the substrate, and need not always be disposed when the quartz substrate is used.

A semiconductor film containing amorphous structure (amorphous silicon film in the present embodiment (not shown)) is formed on the base film 101 at a thickness of 20–100 nm by a known film formation method. As a semiconductor film containing amorphous structure, there are amorphous semiconductor film and microcrystalline semiconductor film and further, a compound semiconductor film containing amorphous structure such as amorphous silicon germanium film etc. may also be included.

A semiconductor film containing crystalline structure (crystalline silicon film in the present embodiment) 102 is formed according to a technology disclosed in the Japanese Patent Application Laid-Open No. Hei 7-130652 (corresponding to U.S. Pat. No. 5,643,826). The technology described in the gazette is the crystallization means that uses catalytic elements for promoting crystallization (one or plural of element selected from nickel, cobalt, germanium, tin, lead palladium, iron and copper; typically nickel) for crystallizing the amorphous silicon film.

More concretely, heat-treatment is conducted under the condition where the catalytic element(s) is held on the surface of the amorphous silicon film to convert the amorphous silicon film to the crystalline silicon film. Although the present Embodiment uses a technology described in the Embodiment 1 of the gazette a technology described in Embodiment 2 may also be used. Though single crystal silicon film and polycrystalline silicon film are both included in crystalline silicon film, the crystalline silicon film formed in the present embodiment is a silicon film having crystal grain boundaries.

Though it depends on hydrogen content in the amorphous silicon film, it is preferable to carry out dehydrogenation process by heating at 400–550° C. for some hours to reduce the contained hydrogen amount at 5 atom % or lower and conduct crystallization process. Though amorphous silicon film may be fabricated by other fabricating methods such as sputtering or vapor deposition, it is preferable to sufficiently reduce impurity elements such as oxygen or nitrogen contained in the film.

Because base film and amorphous silicon film can be fabricated by the same deposition method, they may be successively formed. Scattering of characteristics of the fabricated TFTs may be reduced by making it possible to prevent contamination of the surface by not exposing to the atmosphere after formation of the base film.

Next, a light generated from a laser light source (laser light) is irradiated onto the crystalline silicon film 102 (hereinafter referred to as laser anneal) and a crystalline silicon film 103 in which crystallinity is improved is formed. Though a pulse oscillation type or a continuous oscillation type excimer laser light is preferable for the laser light, a continuous oscillation type argon laser light may also be used. The beam shape of the laser light may be linear, or it may be a rectangular shape.

A light generated from a lamp (lamp radiation) may be irradiated (hereinafter referred to as lamp annealing) may be used in place of laser light. As a lamp radiation, lamp radiation generated from halogen lamp or infrared lamp may be used.

The process of conducting heat treatment (annealing) by laser light or lamp radiation is called a light annealing process. Because light annealing process can conduct a high temperature heat treatment in a short time, effective heat treatment process may be carried out at high throughput even in the case of using a substrate with low heat resistance such as glass substrate etc. Needless to say, since the object is annealing, it can be substituted by a furnace annealing (it may also be called heat annealing) using electric furnace.

In the present Embodiment, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250–500 mJ/cm$^2$ (typically 350–400 mJ/cm$^2$).

Laser annealing process carried out at the above stated conditions has an effect of completely crystallizing the amorphous region remained after heat crystallization as well as reducing defects in the crystalline region already crystallized. Accordingly, the present process may be called a process for improving crystallinity of the semiconductor film, or a process for promoting crystallization of the semiconductor film. Such effects can be obtained by optimizing lamp annealing condition. This condition is referred to as the first annealing condition in the present specification.

Next, a protecting film 104 is formed on crystalline silicon film 103 for the later impurity doping process. Silicon nitride oxide film or silicon oxide film at a thickness of 100–200 nm (preferably 130–170 nm) is used for the protecting film 104. This protecting film 104 has a meaning of not to expose the crystalline silicon film directly to plasma at impurity doping, and to make minute concentration control possible.

Then, a resist mask 105 is formed thereon, and impurity element imparting p-type (hereinafter referred to as p-type impurity element) is doped through protecting film 104. As a p-type impurity element, typically an element belonging to group 13 or more specifically boron or gallium may be used. This process (referred to as channel doping process) is a process for controlling threshold voltage of a TFT. Here, boron is doped by ion doping in which diborane (B$_2$H$_6$) is excited by plasma without mass separation.

By this process impurity region 106 including p-type impurity (boron in the present embodiment) at a concentration of 1×10$^{15}$–1×10$^{18}$ atoms/cm$^3$ (typically 5×10$^{16}$–5×10$^{17}$ atoms/cm$^3$) was formed. In the present specification, an impurity region containing p-type impurity region at least in the above stated concentration range is defined as a p-type impurity region (b). (FIG. 1C)

Next resist mask 105 is removed and resist masks 107–110 are newly formed. Then impurity regions imparting n-type 111–113 are formed by doping impurity element s imparting n-type (hereinafter referred to as n-type impurity element). As an n-type impurity element, typically an element belonging to group 15 or more specifically phosphorus or arsenic may be used. (FIG. 1D)

These low concentration impurity regions 111–113 are impurity regions functioned as LDD regions of the n-channel TFT of the later formed CMOS circuit and sampling circuit. In thus formed impurity regions, n-type impurity element is contained at a concentration of 2×10$^{16}$–5×10$^{19}$ atoms/cm$^3$ (typically 5×10$^{17}$–5×10$^{18}$ atoms/cm$^3$). In the present specification, an impurity region containing n-type impurity region at least in the above stated concentration range is defined as an n-type impurity region (b).

Here, phosphorus is doped by ion doping in which phosphine (PH$_3$) is excited by plasma without mass separation. In this process, phosphorus is doped into the crystalline silicon film through protecting film 107.

Next, protecting film 104 is removed, and irradiation process of laser light was conducted again. Here again excimer laser light of pulse oscillation type or continuous oscillation type is preferable, but argon laser light of continuous oscillation type may also be used. The beam shape of the laser light may be either of linear or rectangular shape. Provided, because activation of the doped impurity element is the object, it is preferable to irradiate with an energy at a level of not melting the crystalline silicon film. It is also possible to conduct laser annealing process with the protecting film 104 left thereon. (FIG. 1E)

In the present Embodiment, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250–500 mJ/cm$^2$ (typically 350–400 mJ/cm$^2$).

The light annealing process carried out on the above stated conditions has an effect of recrystallizing the semiconductor film that was made into amorphous in impurity element doping as well as activating the impurity element imparting n-type or p-type that was doped. It is preferable that the above stated conditions make atomic arrangement coordinated without melting the semiconductor film and at the same time activate the impurity elements. The present process may be referred as a process of activating the impurity element imparting n-type or p-type by light annealing, a process for recrystallizing the semiconductor film or a process of simultaneously carrying out both of them. Such effect can be obtained by optimizing the lamp annealing condition as well. In the present specification, this condition is referred to as the second annealing condition.

By this process, the boundaries of n-type impurity regions (b) 111–113, that is, the junction area with the intrinsic regions (p-type impurity region (b) is also regarded as substantially intrinsic) that exist around n-type impurity region (b) become clear. This means that LDD region and channel formation region may form a very good junction when later finishing TFT.

On activation of the impurity elements by this laser light, activation by heat treatment may also be used at the same time. In case of conducting activation by heat treatment, heat treatment of approximately 450–550° C. may be conducted considering the heat resistance of the substrate.

Next, unnecessary portions of the crystalline silicon film are removed to form island semiconductor layers (hereinafter referred to as active layers) 114–117. (FIG. 1F)

Next, gate insulating film 118 is formed to cover the active layers 114–117. Gate insulating film 118 may be formed into a thickness of 10–200 nm, preferably into 50–150 nm. In the present embodiment, a silicon nitride oxide film is formed into a thickness of 115 nm by plasma CVD with raw materials of $N_2O$ and $SiH_4$. (FIG. 2A)

Figure 2B:
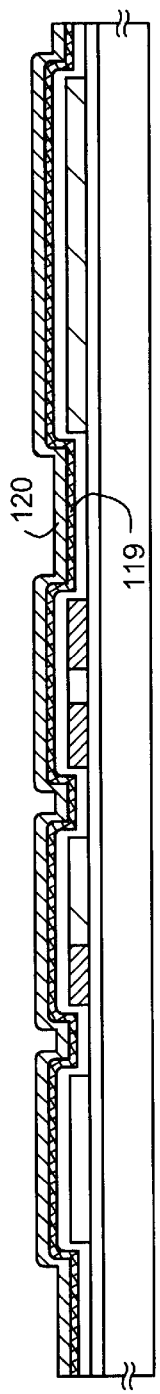
Figure 2C:
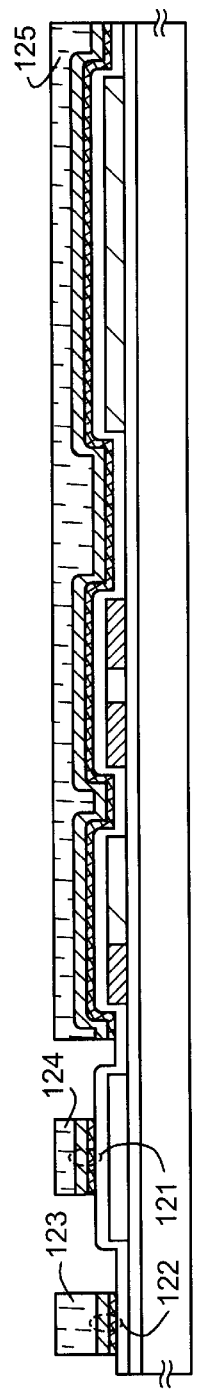
Figure 2D:
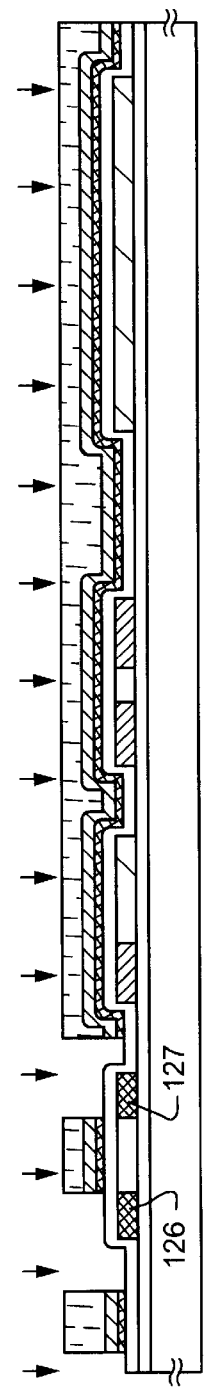

Then, high melting point metal film, that will form a gate wiring, is formed. Although the gate wiring may be formed by a single layer of high melting point metal film, it is preferable to form laminated films of double layers, or triple layers as occasion demands. In the present embodiment, laminated films comprising a first high melting point metal film 119 and a second high melting point metal film 120. (FIG. 2B)

As the first high melting point metal film 119 and the second high melting point metal film 120, an element selected from tantalum (Ta), titanium (Ti), molybdenum (Mo), tungsten (W), chromium (Cr) etc. or a conductive film that has the above stated elements as the main component (typically tantalum nitride film, tungsten nitride film or titanium nitride film) or an alloy film combining those elements (typically Mo—W alloy, Mo—Ta alloy) may be used.

The first high melting point metal film 119 may be formed into 10–50 nm (preferably 20–30 nm) and the second high melting point metal film 120 may be formed into 200–400 nm (preferably 250–350 nm). In the present embodiment, tungsten nitride (WNx) film of 50 nm thick was used as the first high melting point metal film 119 and tungsten (W) film of 350 nm thick was used as the second high melting point metal film 120. In the present Embodiment, these were formed in laminates continuously by sputtering.

Although not shown, it is effective to fabricate a silicon film at a thickness of approximately 2–20 nm under the first high melting point metal film 119. By doing so, the improvement of close adhesion and preventing oxidation of the high melting point metal film can be obtained.

After forming resist masks 123–125, gate wiring 121 and wiring 122 of the p-channel TFT are formed into 400 nm thickness by etching the first high melting point metal film 119 and the second high melting point metal film 120.

Then, p-type impurity element (boron in the present embodiment) is doped with resist masks 123–125 provided, and impurity regions 126 and 127 that include boron at a high concentration are formed. These resist masks 123–125 play a role of preventing the resistivity from increasing by introduction of impurity specifically oxygen into the high melting point metal film in p-type impurity element doping process. Here, boron is doped at a concentration of $3\times10^2$–$3\times10^{21}$ atoms/cm$^3$ (typically $5\times10^{20}$–$1\times10^{21}$ atoms/cm$^3$) by ion doping using diborane ($B_2H_6$). In the present specification, an impurity region that includes p-type impurity region in the above stated concentration range is defined as p-type impurity region (a). (FIG. 2D) Needless to say, the impurity region may also be formed by doping into exposed active layer by etching the gate insulating film.

Figure 2E:
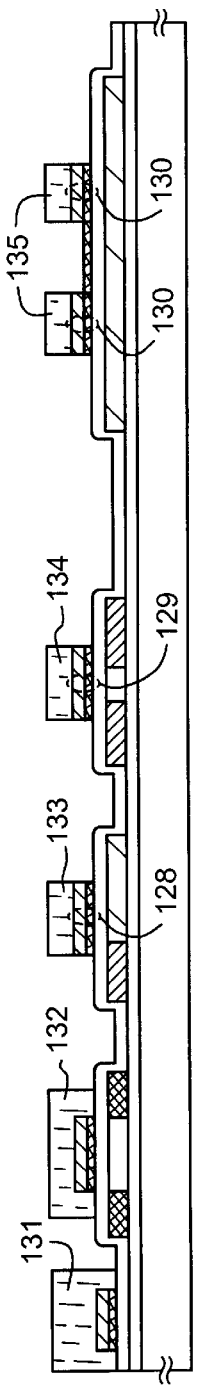

Next, after removing resist masks 123 to 125, resist masks 131 to 135 are formed and gate wirings 128 to 130 of the n-channel TFTs were formed by etching. Here, gate wirings 128 and 129 formed in driver circuit were formed to overlap with a portion of n-type impurity regions (b) 111 to 113 by interposing a gate insulating film. These overlapped regions later become Lov regions. Note that the gate wiring 130 is formed of a continued single pattern in effect although it seems as if there are two in the cross sectional view. (FIG. 2E)

Further, n-type impurity element (phosphorus in embodiment 1) is doped in a self-aligned manner using resist masks 131 to 135 as masks with the masks left as they are. These resist masks 131 to 135 function to prevent increase in resistivity due to added impurity specifically oxygen into high melting point metal in the process of n-type impurity element doping. It is also acceptable to form impurity regions by doping with exposing active layer by etching the gate insulating film. The phosphorus doped into thus formed impurity regions 136 to 139 are set at a concentration of ½ to ⅒ (specifically ⅓ to ¼) of the n-type impurity region (b) (provided it is higher by 5 to 10 times than boron concentration added in the channel doping process, specifically $1\times10^{16}$ to $5\times10^{18}$ atoms/cm$^3$, typically $3\times10^{17}$ to $3\times10^{18}$). In the present Specification, an impurity region containing n-type impurity element at the above stated concentration range is defined as n-type impurity region (c). (FIG. 3A)

Note that phosphorus is doped into all of the n-type impurity regions (b) at a concentration of $1\times10^{16}$ to $5\times10^{18}$ atoms/cm$^3$ except regions hidden under resist masks 131 to 135 in this process however it is at a very low concentration and does not give effect to the function as n-type impurity region (b). Further, although boron is already doped into n-type impurity regions (b) 136 to 139 at a concentration of $1\times10^{15}$ to $5\times10^{18}$ atoms/cm$^3$ in the channel doping process, phosphorus is doped at a concentration of 5 to 10 times that of boron contained in the p-type impurity region (b) and boron does not give effect to the function of n-type impurity region (b) in this case also. Moreover, phosphorus is doped in the p-type impurity region (a) at a concentration of $1\times10^{16}$ to $5\times10^{18}$ atoms/cm$^3$ but it is very low concentration and does not give effect to the function as p-type impurity region (a).

Strictly speaking however, while concentration of phosphorus in portions of n-type impurity region (b) 111 to 113 that overlapped with gate wirings remains at $2\times10^{16}$ to $5\times10^{19}$ atoms/cm$^3$, portions that do not overlap with gate wirings are added with phosphorus of $1\times10^{16}$ to $5\times10^{18}$ atoms/cm$^3$, and contain phosphorus at a slightly higher concentration.

Next, with keeping resist masks 131 to 135 as they are, new resist asks 140 to 142 are formed, and impurity regions 143 to 149 containing phosphorus at a high concentration were formed by adding n-type impurity element (phosphorus in embodiment 1). It is also acceptable to form impurity regions by performing doping with exposing active layer. Again ion doping was conducted by utilizing phosphine ($PH_3$) and the phosphorus concentration in these regions are set at $1\times10^{20}$ to $1\times10^{21}$ atoms/cm$^3$ (specifically $2\times10^{20}$ to $5\times10^{21}$ atoms/cm$^3$). (FIG. 3B)

Note that in this Specification an impurity region containing n-type impurity element in the above stated concentration range is defined as n-type impurity region (a). Further, although phosphorus or boron added in the preceding processes are already contained in the regions where impurity regions 143 to 149 are formed, influence of phosphorus or boron added in the preceding processes need not be considered since phosphorus is later added at a sufficiently high concentration. Therefore, it is acceptable to refer to impurity regions 143 to 149 as n-type impurity region (a) in this Specification.

Phosphorus is doped in a portion of impurity regions 126 and 127 (p-type impurity regions (a) that do not overlap with mask 132) at a concentration of $1 \times 10^{20}$ to $1 \times 10^{21}$ atoms/cm$^3$, but boron is already doped at a concentration higher by at least 3 times. Therefore, already formed p-type impurity regions function as p-type impurity region without being converted into n-type.

Example of performing ion doping by holding a resist mask on a gate electrode is shown in the above stated impurity region formation. However, a mask formed of silicon as a main component and patterned by using a mask etc. may also be used in place of resist mask. Provided, this musk needs to have a film thickness capable of preventing penetration of oxygen ion etc. into the gate electrode. The mask formed of silicon as a main component may be formed from either silicon nitride film, silicon oxide film, oxidized silicon nitride film or a laminate combining these films.

After resist masks 131 to 135 and 140 to 142 are removed, an insulating film 151 which will form a part of the first interlayer insulating film is formed. Insulating film 151 may be formed from a silicon nitride film, a silicon oxide film, an oxidized silicon nitride film or a laminate combining these films. The film thickness may be set at 0.1 to 0.4 μm. In embodiment 1, an oxidized silicon nitride film (provided nitrogen concentration is 25 to 50 atom %) of 0.3 μm thick formed by plasma CVD using Si H$_4$, N$_2$O and NH$^3$ as raw material gases is used.

A heat treatment process is performed next in order to activate the impurity elements of n-type or p-type conductivity and which have been doped at their respective concentrations. Furnace annealing, laser annealing, or rapid thermal annealing (RTA) can be performed for this process. The activation process is performed by furnace annealing here. Heat treatment is performed in a nitrogen atmosphere at between 300 and 650° C., preferably from 400 to 550° C., at 450° C. for 2 hours here.

The catalytic element (nickel in embodiment 1) used in crystallization of an amorphous silicon film moved in the direction of the arrows and is captured in a region containing phosphorus at a high concentration (gettering) formed in the process of FIG. 3B. This is a phenomenon originated from Bettering effect of a metal element by phosphorus. As a result, the concentration of nickel contained in channel forming regions 152 to 156 is reduced below $1 \times 10^{17}$ atoms/cm$^3$ (preferably to $1 \times 10^{16}$ atoms/cm$^3$).

Conversely, catalytic element segregated at a high concentration in the regions which functioned as gettering sights of the catalytic element (regions where impurity regions 143 to 149 were formed and a portion of impurity regions 126 and 127 formed in the process of FIG. 3B) and the catalytic element existed at a concentration exceeding $1 \times 10^{17}$ atoms/cm$^3$ (typically $1 \times 10^{19}$ to $5 \times 10^{20}$ atoms/cm$^3$).

Further, a hydrogenation process is performed on the active layers by performing heat treatment in an atmosphere containing 3 to 100% hydrogen for 1 to 12 hours at between 300 and 450° C. This process is a process to terminate dangling bonds in the semiconductor layers by thermally activated hydrogen. Plasma hydrogenation (using hydrogen activated by a plasma) may be performed as another hydrogenation means.

After completing the activation process, an interlayer insulating film 157 with a 0.5 to 1.5 μm thickness is formed on the insulating film 151. In embodiment 1, a silicon oxide film is formed into 0.7 μm thick by plasma CVD as interlayer insulating film 157. Thus the 1 μm thick laminate film of the insulating film 151 and the interlayer insulating film (silicon oxide film) 157 is formed as a first interlayer insulating film.

Contact holes are then formed in order to reach the source regions or the drain regions of the respective TFTs, and source wirings 158 to 161, and drain wirings 162 to 165 are formed. Note that, although not shown in the figures, the drain wirings 162 and 163 are connected as the same drain wiring in order to form a CMOS circuit. Further, although not shown in the figures, in embodiment 1 the electrodes are made with a three-layer structure laminate film of a 100 nm Ti film, a 300 nm aluminum film containing Ti, and a 150 nm Ti film formed successively by sputtering.

A silicon nitride film, a silicon oxide film, or a nitrated silicon oxide film is formed to a thickness of between 50 and 500 nm (typically 200 to 300 nm) next as a passivation film 166. A plasma treatment introducing N$_2$, NH$_3$, etc. is performed preceding formation of the film, and a heat treatment after the film formation in embodiment 1. The hydrogen that is activated by the plasma processing is supplied throughout the first interlayer insulating film. By performing heat treatment in this state, as well as improving film quality of passivation film 166, hydrogen doped into the first interlayer insulating film is diffused to the underlayer and the active layer can be effectively hydrogenated.

Figure 23:
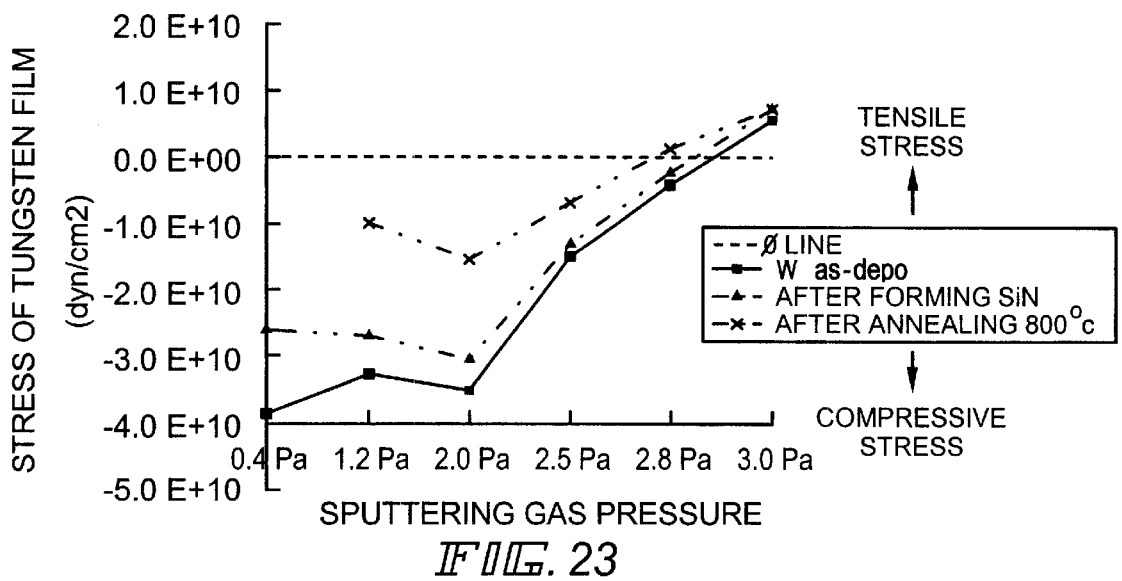
FIG. 23 is a diagram showing the relationship between the sputtering pressure and stress.
Figure 24:
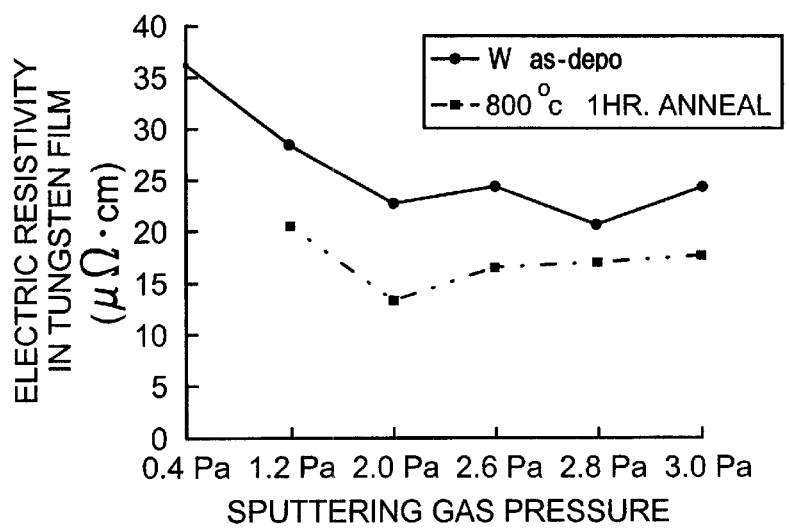
FIG. 24 is a diagram showing the relationship between the sputtering pressure and electric resistivity.
Figure 25:
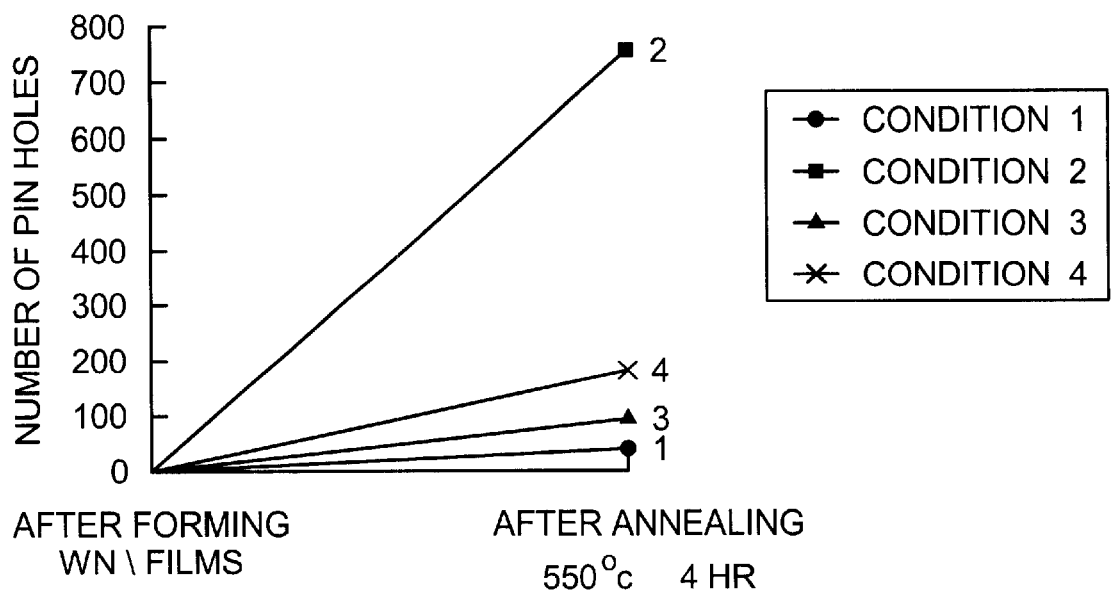
FIG. 25 is a diagram showing the number of pin holes after heat treatment.

FIG. 23 shows a relationship between sputtering gas pressure and stress. Stress of tungsten film after formation, stress of tungsten film after forming a silicon nitride film (corresponds to passivation film) thereon, and stress of tungsten film after forming a silicon nitride film and performing heat treatment at 800° C. for an hour are respectively measured. It is read from FIG. 23 that the stress decreases when heat treatment is applied. FIG. 24 shows a relationship between sputtering gas pressure and electric resistivity in a tungsten film formed by using a 3.5N purity target. As shown in FIG. 24, the electric resistivity decreases when heat treatment is performed. From the results shown in FIGS. 23 and 24, there arises no problem of stress and electric resistivity when passivation film formation and heat treatment are performed after impurity doping process of embodiment 1.

Further, after forming the passivation film 166, an additional hydrogenation process may be performed. For example, it is good to perform heat treatment for 1 to 12 hours at between 300 and 450° C. in an atmosphere including from 3 to 100% hydrogen. Or, a similar result can be obtained by using plasma hydrogenation. Note that openings may be formed here in the passivation film 166 at positions where contact holes will be formed later in order to connect the pixel electrode and the drain wirings.

A second interlayer insulating film 167 made from an organic resin is formed next with an approximately 1 μm thickness. Polyimide, acrylic, polyamide, polyimide amide, BCB (benzocyclobutane), etc., can be used as the organic resin. The following points can be given as the benefits of using an organic resin film: easy film deposition; the parasitic capacitance can be reduced because the specific dielectric constant is low; and superior levelness. Note that in addition to the above, other organic resin films, organic SiO compounds, etc. can be used. A thermal polymerization type polyimide is used here, and after application to the substrate, it is baked at 300° C. to form the film.

A shielding film 168 is formed next on the second interlayer insulating film 167 in the region that becomes the pixel circuit. Note that a word shielding film is used here to have meaning of shielding a light and electromagnetic wave in this Specification.

The shielding film 168 is a film of an element chosen from among aluminum (Al), titanium (Ti), and tantalum (Ta), or a film with one of these as its principal constituent, formed to a thickness of between 100 and 300 nm. Aluminum film containing 1 wt % titanium is formed into 125 nm thick in embodiment 1.

Note that if an insulating film such as a silicon oxide film is formed to a thickness of 5 to 50 nm on the second interlayer insulating film 167, then the adhesiveness of the shielding film formed on top can be increased. Further, if plasma processing using $CF_4$ gas is performed on the surface of the second interlayer insulating film 167, which is formed by an organic resin, then the adhesiveness to the shielding film formed on this film can be increased by surface refinement.

Further, it is possible to form other connecting wirings by this aluminum film containing titanium, not only the shielding film. For example, a connecting wiring for connecting between circuits can be formed inside the driver circuit. However, in this case, before depositing the material that forms the shielding film or the connecting wiring, it is necessary to form contact holes, in advance, in the second interlayer insulating film.

Next, the oxide film 169 with a thickness from 20 to 100 nm (preferably between 39 and 50 nm) is formed on the surface of the shielding film 168 by anodic oxidation or plasma oxidation. An aluminum oxide film (alumina film) is formed here as the anodic oxide film 169 because an aluminum film, or a film with aluminum as its principal constituent, is used as the shielding film 168 in embodiment 1.

When performing anodic oxidation processing, a tartaric acid ethylene glycol solution with a sufficiently low alkaline ion concentration is first manufactured. This is a solution in which a 15% tartaric acid ammonium aqueous solution and an ethylene glycol solution are mixed in a 2:8 ratio. Aqueous ammonia is added thereto so that the pH is regulated to be 7±0.5. A platinum electrode is placed in the solution as a cathode, the substrate on which the shielding film 168 is formed is immersed in the solution, and a constant dc current (from several mA to several hundred mA) is applied with the shielding film 168 as an anode.

The voltage between the cathode and the anode in the solution changes along with time in accordance with the oxide film growth. The voltage is regulated by an increasing rate of 100 V/min with the current kept at constant, and the process is stopped when the voltage becomes 45 V. Thus the anodic oxide film 169 can be formed with a thickness of approximately 50 nm on the surface of shielding film 168. As a result the thickness of shielding film 168 became 90 nm. Note that the numerical values shown here for the anodic oxidation process are only examples, and that they may naturally be changed to the most suitable values depending upon the size of the element being manufactured, etc.

Further, the structure used here has the insulating film being formed only on the surface of the shielding film by anodic oxidation, but the insulating film may also be performed by a gas phase method, such as plasma CVD, thermal CVD, or sputtering. In that case, it is preferable to make the film thickness from 20 to 100 nm (more preferably between 30 and 50 nm). Furthermore, a silicon oxide film, a silicon nitride film, a nitrated silicon oxide film, a DLC (diamond like carbon) film, or an organic resin film may also be used. Further, a combined laminate film of these may be used.

Contact holes are formed next in the second interlayer insulating film 167 and in the passivation film 166 in order to reach the drain wiring 165, and the pixel electrode 170 is formed. Note that pixel electrodes 171 and 172 are each separate pixel electrodes for adjoining pixels. A transparent conductive film may be used for the pixel electrodes 170 to 172 for the case of a transmission type liquid crystal display device, while a metallic film may be used for a reflective type liquid crystal display device. An indium tin oxide (ITO) film with a thickness of 100 nm is formed here by sputtering because a transmission type liquid crystal display device is used here.

Further, a storage capacitor 173 is formed because pixel electrode 170 and shielding film 168 overlapped by interposing anodic oxide film 169. In this case, it is preferable to set the shielding film 168 to a floating state (an electrically isolated state) or to constant electric potential, preferably a common electric potential (the median electric potential of an image signal sent as data).

Thus, the active matrix substrate, containing the driver circuit and the pixel circuit on the same substrate, is completed. Note that a p-channel TFT 301, and n-channel TFTs 302 and 303 are formed in the driver circuit in FIG. 4A, and that a pixel TFT 304 is formed from an n-channel TFT in the pixel circuit.

A channel forming region 201 and a source region 202 and a drain region 203 each formed by a p-type impurity region (a) in the p-channel TFT 201 of the driver circuit are formed. Note that a region that contains phosphorus at a concentration of $1\times10^{20}$ to $1\times10^{21}$ atoms/cm³ exists in a portion of a source region or a drain region in effect. In that region the catalytic element gettered in the process of FIG. 3C exists at a concentration exceeding $5\times10^{18}$ atoms/cm³ (typically $1\times10^{19}$ to $5\times10^{20}$ atoms/cm³).

Further, a channel forming region 204, a source region 205, and a drain region 206 are formed in the n-channel TFT 302, and a region overlapping with the gate wiring by interposing a gate insulating film (such region is referred to as Lov region. 'ov' means overlap) 207 is formed in one side of the channel forming region (drain region side). Here, Lov region 207 contains phosphorus at a concentration of $2\times10^{16}$ to $5\times10^{19}$ atoms/cm³ and is formed to wholly overlap with the gate wiring.

Additionally, a channel forming region 208, a source region 209, and a drain region 210 are formed in the n-channel TFT 303. LDD regions 211 and 212 are formed in both sides of the channel forming region. Note that the regions overlapping with the gate wiring by interposing an insulating film (Lov regions) and the regions that are not overlapped with the gate wiring (such region is referred to as Loff regions. 'off' means offset) are realized because a portion of the LDD regions 211 and 212 are placed so as to overlap with the gate wiring in this structure.

Figure 5:
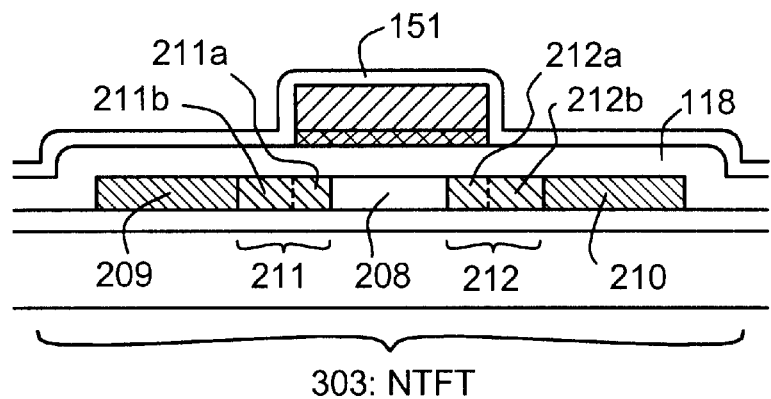
FIG. 5 is a diagram showing a cross sectional structure of n-channel TFT.

A cross sectional view shown in FIG. 5 is an enlarged diagram showing n-channel TFT 303 shown in FIG. 4A in the state of being manufactured to the process of FIG. 3C. As shown here, LDD region 211 is further classified into Lov region 211a and Loff region 21b. Phosphorus is contained in the Lov region 211a at a concentration of $2\times10^{16}$ to $5\times10^{19}$ atoms/cm³, whereas it is contained at a concentration 1 to 2 times as much (typically 1.2 to 1.5 times) in the Loff region 211b.

Further, channel forming regions 213 and 214, a source region 215, a drain region 216, Loff regions 217 to 220, and an n-type impurity region (a) 221 contacting the Loff regions 218 and 219 are formed in the pixel TFT 304. The source region 215, and the drain region 216 are each formed n-type impurity region (a) at this point, and the Loff regions 217 to 220 are formed by n-type impurity region (c).

The structure of the TFTs forming each of the circuits of the pixel circuit and the driver circuits can be optimized to correspond to the required circuit specifications, and the operation performance of the semiconductor device and its reliability can be increased in embodiment 1. Specifically, the LDD region placement in an n-channel TFT is made to differ depending upon the circuit specifications, and by using an Lov region or an Loff region properly, TFT structures with fast operating speeds and which place great importance on measures to counter hot carriers, and TFT structures that place great importance on low off current operation, can be realized on the same substrate.

For the case of an active matrix type liquid crystal display device, for example, the n-channel TFT 302 is suitable for driver circuits that place great importance on high speed, such as a shift register circuit, a frequency divider circuit, a signal divider circuit, a level shifter circuit, and a buffer circuit. In other words, by placing the Lov region in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, Lov regions can be placed in both sides of the channel forming region.

Further, the n-channel TFT 303 is suitable for a sampling circuit (a sample hold circuit) which places emphasis on both hot carrier countermeasures and low off current operation. In other words, hot carrier countermeasures can be realized by placement of the Lov region, and in addition, low off current operation is realized by placement of the Loff region. Furthermore, the functions of the source region and the drain region of a sampling circuit reverse, and the carrier movement direction changes by 180°; therefore a structure that has linear symmetry with the center of the gate wiring must be used. Note that it is possible to only form the Lov region, depending upon the circumstances.

Further, the n-channel TFT 304 is suitable for a pixel circuit or a sampling circuit (sample hold circuit) which place great importance on low off current operation. Namely, the Lov region, which is a cause of an increase in the off current value, is not employed, only the Loff region is used, allowing low off current operation to be realized. Furthermore, by utilizing an LDD region with a concentration lower than that of the driver circuit LDD region as the Loff region, although the on current value will fall a little, it is a thorough measure for lowering the off current value. Additionally, it has been confirmed that an n-type impurity region (a) 221 is extremely effective in lowering the off current value.

Further, the length (width) of the Lov region 207 of the n-channel TFT 302 may be between 0.5 and 3.0 $\mu$m, typically from 1.0 to 1.5 $\mu$m, for a channel length of 3 to 7 $\mu$m. Further, the length (width) of the Lov regions 211a and 212a of the n-channel TFT 503 may be from 0.5 to 3.0 $\mu$m, typically between 1.0 and 1.5 $\mu$m, and the length (width) of the Loff regions 211b and 212b may be from 1.0 to 3.5 $\mu$m, typically between 1.5 and 2.0 $\mu$m. Moreover, the length (width) of the Loff regions 217 to 220 formed in the pixel TFT 304 may be from 0.5 to 3.5 $\mu$m, typically between 2.0 and 2.5 $\mu$m.

Further, another characteristic is that the p-channel TFT 301 is formed in a self aligning manner, while the n-channel TFTs 302 to 304 are formed in a non-self aligning manner.

By using alumina film which has high dielectric constant of 7 to 9 for the dielectric of the storage capacitor in this embodiment, it became possible to reduce the area in which a required capacitor. Further, by using the shielding film formed over pixel TFT as one of the electrodes for the storage capacitor as in embodiment 1, aperture ratio in the image display section of the active matrix liquid crystal display device can be improved.

The structure of the storage capacitor of the present invention is not necessarily limited to the one shown in embodiment 1. For example, the storage capacitor described in Japanese Patent Application No. Hei 9-316567 (Publication No. Hei 11-133463) or Japanese Patent Application No. Hei 10-254097 (Publication No. 2001-56485) may be used.

A process of manufacturing an active matrix type liquid crystal display device from an active matrix substrate is next explained. As shown in FIG. 4B, an alignment film 401 is formed for the substrate in the state of FIG. 4A. In the present embodiment, a polyimide film is used for the alignment film. A transparent conductive film 403 and an alignment film 404 are formed on an opposing substrate 402. Color filter or a shielding film may be formed on the opposing substrate if necessary.

After forming the alignment films, a rubbing process is performed to give the liquid crystal molecules a certain fixed pre-tilt angle, so that they are aligned. The active matrix substrate, on which a pixel circuit and driver circuits are formed, and the opposing substrate are stuck together through a sealing material or spacers (not shown in the figures) in accordance with a known cell assembly process. A liquid crystal material 405 is next injected between both substrates, and the cell is completely sealed by a sealant (not shown in the figures). A known liquid crystal material may be used as the liquid crystal material. Thus the active matrix type liquid crystal display device shown in FIG. 6 is completed.

Figure 6:
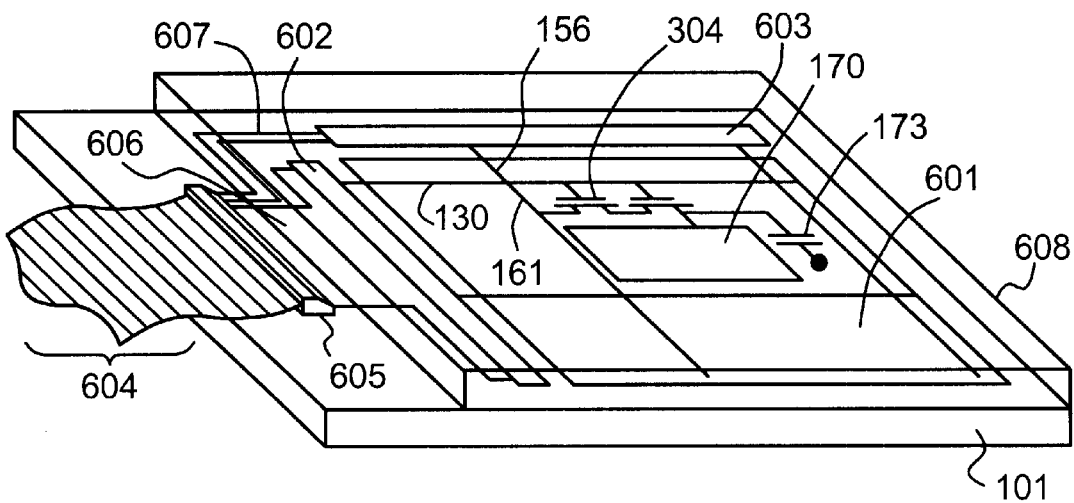
FIG. 6 is a diagram showing a perspective view of active matrix liquid crystal display device.

The structure of the active matrix liquid crystal display device is next described by referring to the perspective view of FIG. 6. In order to correspond FIG. 6 to cross sectional view of FIGS. 1 to 4, common reference numerals are used. The active matrix substrate comprises a pixel circuit 601, scanning (gate) signal driver circuit 602, image (source) signal driver circuit 603 formed over a glass substrate 101. A pixel TFT 304 of the pixel circuit is a n-channel TFT, and driver circuits disposed to surround the pixel circuit are basically formed from CMOS circuits. Scanning signal driver circuit 602 and image signal driver circuit 603 are respectively connected to the pixel circuit 601 through gate wiring 130 and source wiring 161. Connecting wirings 606 and 607 are formed, from external input-output terminal 605 that are connected to FPC 604 to input-output terminal of a driver circuit.

[Embodiment 2]

Figure 7:
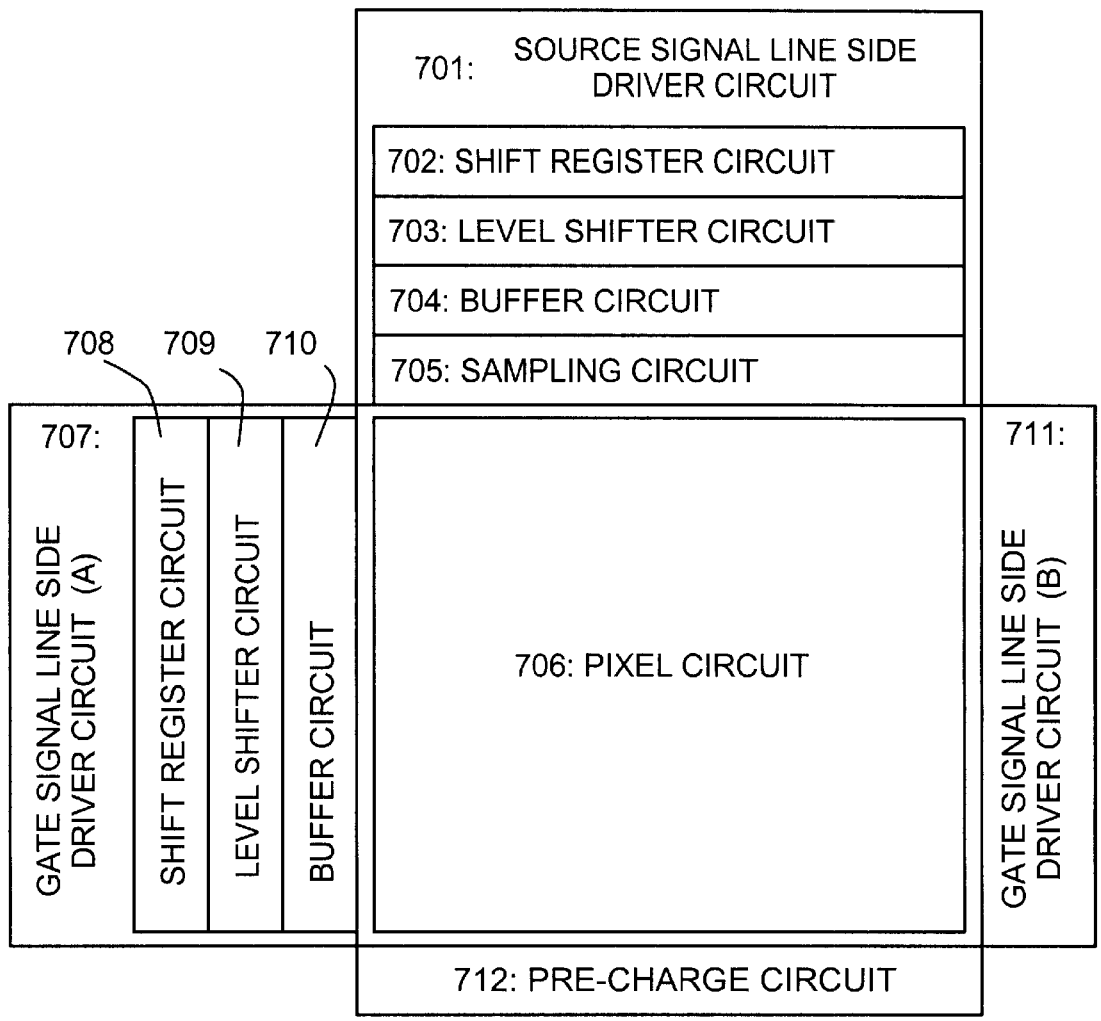
FIG. 7 is a diagram showing the structure of pixel circuit and control circuit.

FIG. 7 shows an example of circuit structure of the active matrix substrate shown in embodiment 1. The active matrix substrate of embodiment 2 has a source signal line side driver circuit 701, a gate signal line side driver circuit (A) 707, a gate signal line side driver circuit (B) 711, a precharge circuit 712, and a pixel circuit 706. Through the Specification, driver circuit is a generic name including source signal line side driver circuit 701 and a gate signal line side driver circuit 707.

The source signal line side driver circuit 701 is provided with a shift register circuit 702, a level shifter circuit 703, a buffer circuit 704, and a sampling circuit 705. Further, the gate signal line side driver circuit (A) 707 is provided with a shift register circuit 708, a level shifter circuit 709, and a buffer circuit 710. The gate signal line side driver circuit (B) 711 has a similar structure.

The driver voltages for the shift register circuits 702 and 708 is between 5 and 16 V here (typically 10 V), and the structure shown by reference numeral 302 in FIG. 4A is suitable for n-channel TFTs used in the CMOS circuits forming the shift register circuits.

Furthermore, the driver voltage becomes high at between 14 and 16 V for the level shifter circuits 703 and 709, and the buffer circuits 704 and 710, but similar to the shift register circuits, CMOS circuits containing the n-channel TFT 302 shown in FIG. 4A are suitable. Note that using a multi-gate structure, such as a double gate structure and a triple gate structure for the gate wiring is effective in increasing reliability in each circuit.

Further, the sampling circuit 705 has a driver voltage of between 14 and 16 V, but the source region and the drain region are inverted and it is necessary to reduce the off current value, so CMOS circuits containing the n-channel TFT 303 of FIG. 4A are suitable. Note that only the n-channel TFT is shown in FIG. 4A, but in practice the n-channel TFT and a p-channel TFT are combined when forming the sampling circuit.

Further, the pixel circuit 706 has a driver voltage of between 14 and 16 V, but it is necessary to reduce the off current value even lower than that of the sampling circuit 705. Therefore it is preferable to use a structure in which Lov region is not disposed, and it is preferable to use n-channel TFT 304 of FIG. 4A for the pixel TFT.

Note that the structure of embodiment 2 can be easily realized by manufacturing a TFT according to manufacturing method shown in embodiment 1. Though the embodiment 2 shows only the structures of pixel circuit and driver circuit, it is possible to form a signal divider circuit, a frequency divider circuit, D/A converter circuit, operational amplifier circuit, γ compensation circuit, and further signal processing circuits (they may also be referred to as logic circuits) such as a memory circuit and a micro processor circuit over a same substrate by following the manufacturing method of embodiment 1.

As stated above, the present invention enables to materialize a semiconductor device comprising a pixel circuit and a driver circuit for driving the pixel circuit over a substrate, such as a semiconductor device having a signal processing circuit, a driver circuit and a pixel circuit over a same substrate.

[Embodiment 3]

A case of forming TFTs through different steps from those of embodiment 1 is described in embodiment 3 by using FIGS. 8A to 8D. Note that because only a part of the way is different from embodiment 1 and others are similar, same reference numerals are used for the same process. The example is given by the same impurity element as embodiment 1 for the impurity elements doped.

Firstly processes up to FIG. 3B are performed through the steps of embodiment 1. The figure corresponding to FIG. 3B is FIG. 8A.

After removing resist masks 131 to 135 and 140 to 142, nitrification process is performed onto gate wiring 121 and 128 to 130, and wiring 122.

The nitrification process here denotes a heat nitrification (heat treatment in an atmosphere containing ammonia or active nitrogen atoms) or plasma nitrification (a treatment in which plasma is generated by introducing ammonia gas or nitrogen gas into a reaction chamber under highly vacuum state and applying high frequency electric power).

In embodiment 3 a plasma nitrification using ammonia gas is performed and nitride film 506 to 510 are formed on the surface of gate wirings and wirings. (FIG. 8B) Generation of pin holes is prevented by performing this plasma nitrification. Since tungsten nitride has a sufficient conductivity, they function as wirings.

Heat treatment is performed next similarly with embodiment 1 and impurity element activation and catalytic element reduction were conducted. (FIG. 8C) Note that a protection film comprising a silicon nitride film may be formed similarly to embodiment 1 before performing the heat treatment.

The throughput may be improved by omitting the process of FIG. 8C by increasing the temperature of the process of FIG. 8B to conduct impurity element activation and catalytic element reduction at the same time with formation of nitride film on the gate electrodes.

Thus low electric resistivity of the wirings can be kept as well as improving oxidation resistance of the wirings.

From hereafter, processes may be performed according to embodiment 1. (FIG. 8D) Note that it is possible to apply the structure of embodiment 3 in forming active matrix liquid crystal display device of embodiment 2.

[Embodiment 4]

In embodiment 4 a case of manufacturing TFTs by a different process order from that of embodiment 1 is described. Note that only a part of the way is different from embodiment 1 and others are similar. The example is given by the same impurity element as embodiment 1 for the impurity elements doped.

First, up to a protection film 104 are formed by following the steps of embodiment 1. Resist masks are formed thereon to dope n-type impurity element under the same condition as FIG. 1D. Thus n-type impurity region (b) is formed.

The resist masks are removed next and new resist masks are formed. The channel doping process is performed under the same condition as FIG. 1C. Thus p-type impurity region (b) is formed.

From hereafter, processes from FIG. 1E may be performed according to embodiment 1. Note that it is possible to apply the structure of embodiment 4 in forming active matrix liquid crystal display device of embodiment 2.

[Embodiment 5]

In embodiment 5 a case of manufacturing TFTs by a different process order from that of embodiment 1 is described by using FIGS. 9A to 9D. Note that because only a part of the way is different from embodiment 1 and others are similar, same reference numerals are used for the same process. The example is given by the same impurity element as embodiment 1 for the impurity elements doped.

Figure 9A:
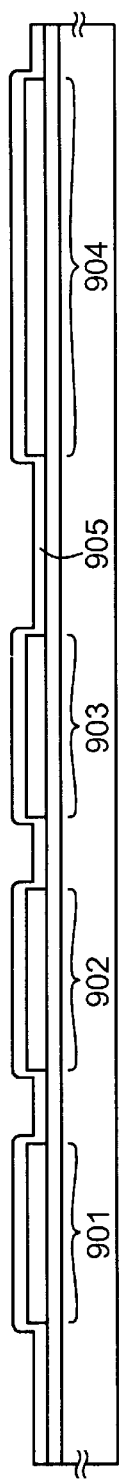
FIG. 9 shows a manufacturing method of AM-LCD.

First processes up to FIG. 1B are performed according to processes of embodiment 1. The crystalline silicon film 103 is then patterned to form active layers 901 to 904 and a protection film 905 comprising an insulating film containing silicon (silicon oxide film in embodiment 5) is formed thereon into 120 to 150 nm. (FIG. 9A)

Note that while embodiment 5 shows an example of patterning crystalline silicon film after laser annealing process (the first annealing condition), it is possible to take the steps in reverse order.

Figure 9B:
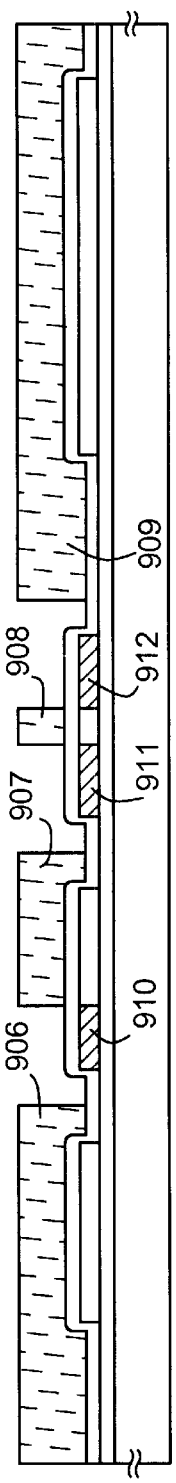

Resist masks 906 to 909 are formed next and n-type impurity element is doped under the same condition as FIG. 1D. N-type impurity regions (b) 910 to 912 are thus formed. (FIG. 9B)

Figure 9C:
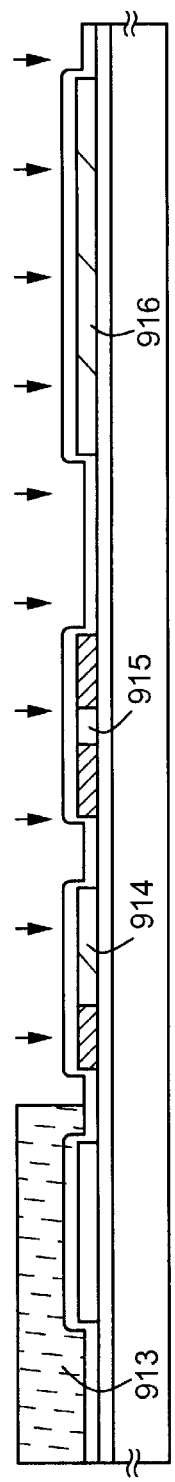

Next resist masks 906 to 909 are removed and a new resist mask 913 is formed. Channel doping process under the same conditions as FIG. 1 is performed. P-type impurity regions (b) 914 to 916 are thus formed. (FIG. 9C)

Figure 9D:
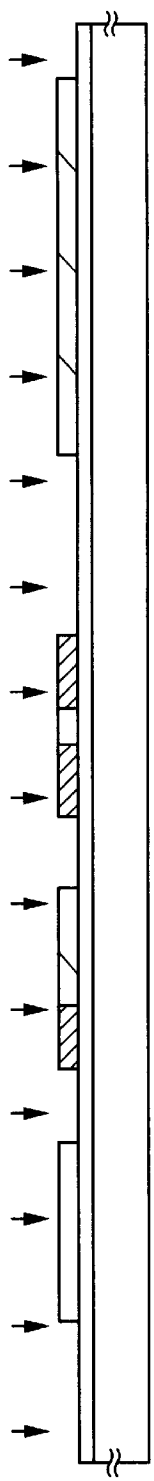

Resist mask 913 is removed and a laser annealing process (the second annealing condition) is performed under the same conditions as FIG. 1E, thereby activating n-type or p-type impurity elements doped, effectively. (FIG. 9D)

From hereafter, processes from FIG. 2A may be performed according to embodiment 1. Note that it is possible to apply the structure of embodiment 5 in forming active matrix liquid crystal display device of embodiment 2. Further, it is possible to combine embodiment 5 with embodiment 3.

[Embodiment 6]

In embodiment 6 a case of manufacturing TFTs by a different process order from that of embodiment 1 is described. Note that only a part of the way is different from embodiment 1 and others are similar. The example is given by the same impurity element as embodiment 1 for the impurity elements doped.

First processes up to FIG. 1B are performed according to processes of embodiment 1, and the state of FIG. 9A is obtained according to the processes of embodiment 5. Note that while embodiment 6 shows an example of patterning crystalline silicon film after laser annealing process (the first annealing condition), it is possible to take the steps in reverse order.

Resist masks are formed and channel doping process under the same conditions as FIG. 1 is performed. P-type impurity regions (b) are thus formed.

The resist masks are removed and new resist masks are formed. N-type impurity element is then doped under the same conditions as FIG. 1D. N-type impurity regions (b) are thus formed.

Activation of the doped n-type or p-type impurity elements may be performed by conducting laser annealing process (the second annealing condition) similar to FIG. 9D described in embodiment 5, and processes after FIG. 2A may be performed according to processes of embodiment 1. Note that it is possible to apply the structure of embodiment 6 in forming active matrix liquid crystal display device of embodiment 2. Further, it is possible to combine embodiment 6 with embodiment 3.

[Embodiment 7]

In embodiment 7 a case of manufacturing TFTs by a different process order from that of embodiment 1 is described. Note that only a part of the way is different from embodiment 1 and others are similar. The example is given by the same impurity element as embodiment 1 for the impurity elements doped.

The state of FIG. 1A is obtained first according to embodiment 1. A protection film is then formed on the formed crystalline silicon film 102 into a thickness of 120 to 150 nm. A resist mask is formed thereon and channel doping process is performed under the same conditions as FIG. 1C. P-type impurity region (b) is thus formed.

Next resist mask and protection film are removed and laser annealing process (the first annealing condition) is performed under the same conditions as FIG. 1B. Crystallinity of the crystalline silicon film hidden by the resist mask is improved in this process, and the doped p-type impurity element is activated as well as recrystallizing the silicon film that became amorphous in the p-type impurity region (b).

A protection film is again formed into a thickness of 120 to 150 nm and a resist mask is formed. N-type impurity element is doped under the same conditions as FIG. 1D. N-type impurity region (b) is thus formed.

The resist mask and the protection film are removed and a laser annealing process under the same conditions as FIG. 1E (the second annealing condition) is performed. By doing so, doped n-type or p-type impurity elements are effectively activated.

Note that laser annealing process (the first annealing condition) may be performed by remaining the protection film. In this case the process for forming a new protection film can be omitted. However, there is decrease in the laser light by interposing the protection film, and it is necessary to set the laser energy density at a higher level. It is also possible to leave the protection film during laser annealing process (the second annealing condition). In this case too the laser energy density is set, by considering the protection film.

Processes after FIG. 1F may be performed hereafter according to processes of embodiment 1. Note that it is possible to apply the structure of embodiment 7 in forming active matrix liquid crystal display device of embodiment 2. Further, it is possible to combine embodiment 7 with embodiment 3.

Further, while laser annealing processes are performed twice in the embodiment 7, it may be a laser annealing of once. Though it is necessary to set the laser annealing process to the first annealing condition, the number of processes can be reduced.

[Embodiment 8]

In embodiment 8 a case of manufacturing TFTs by a different process order from that of embodiment 1 is described by using FIGS. 10A to 10D. Note that because only a part of the way is different from embodiment 1 and others are similar, same reference numerals are used for the same process. The example is given by the same impurity element as embodiment 1 for the impurity elements doped.

Figure 10A:
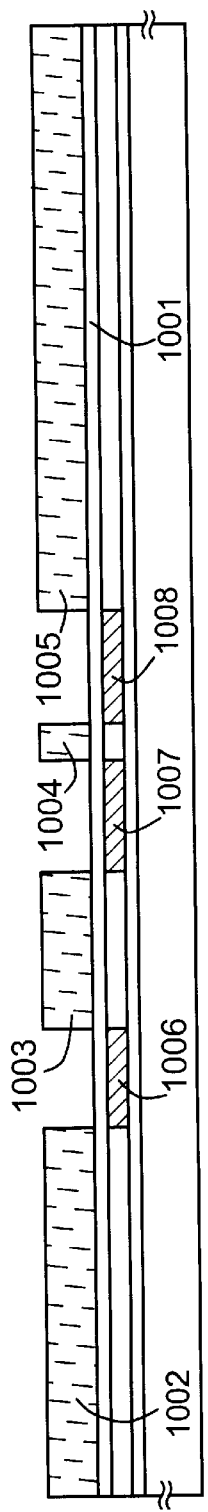
FIG. 10 shows a manufacturing method of AM-LCD.

Firstly the state of FIG. 1A is obtained by following the processes of embodiment 1. A protection film 1001 is formed on thus formed crystalline silicon film 102 into a thickness of 120 to 150 nm. Resist masks 1002 to 1005 are formed thereon and n-type impurity element is doped under the same conditions as FIG. 1D. N-type impurity regions (b) 1006 to 1008 are thus formed. (FIG. 10A)

Resist masks 1002 to 1005 and the protection film 1001 is removed next and laser annealing process (the first annealing condition) is performed under the same conditions as FIG. 1B. Crystallinity of the crystalline silicon film hidden by the resist masks 1002 to 1005 is improved in this process, and the doped n-type impurity element is activated as well as recrystallizing the silicon film that became amorphous in the n-type impurity region (b) 1006 to 1008. (FIG. 10B) A protection film 1011 is again formed into a thickness of 120 to 150 nm, and a resist mask 1012 is formed. Channel doping process is performed under the same conditions as FIG. 1C. P-type impurity regions (b) 1013 to 1015 are thus formed. (FIG. 10C)

The resist mask 1012 and the protection film 1011 are thus removed and laser annealing process under the same conditions as FIG. 1E (the second annealing condition) is performed. Doped n-type or p-type impurity elements are effectively activated. (FIG. 10D)

Figure 10B:
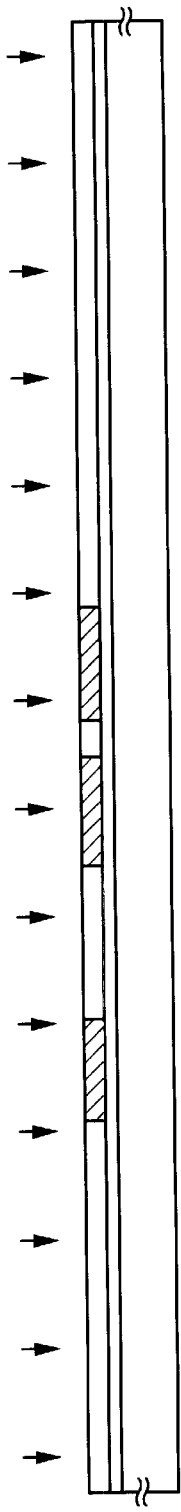
Figure 10C:
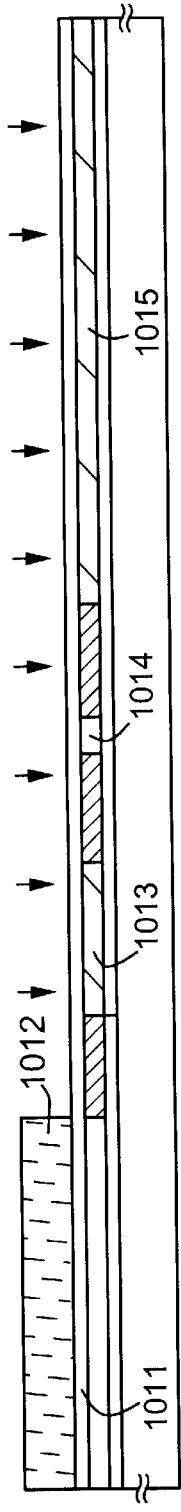

Note that the process of FIG. 10B may be performed by remaining the protection film 1001. In this case the process for forming a new protection film 1011 can be omitted. However, there is decrease in the laser light by interposing the protection film, and it is necessary to set the laser energy density at a higher level. It is also possible to leave the protection film 1011 during laser annealing process of FIG. 10D. In this case too the laser energy density is set, by considering the protection film.

Processes after FIG. 1F may be performed hereafter according to processes of embodiment 1. Note that it is possible to apply the structure of embodiment 8 in forming active matrix liquid crystal display device of embodiment 2. Further, it is possible to combine embodiment 8 with embodiment 3.

Figure 10D:
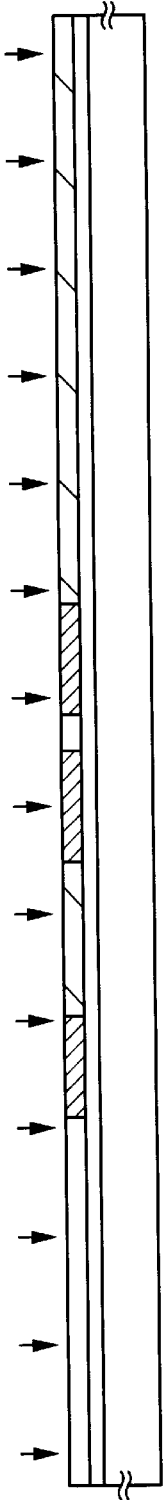

Further, embodiment 8 is characterized by omitting the laser annealing process of FIG. 10B (the first annealing condition) and combine the process in the laser annealing process of FIG. 10D. Though it is necessary to set the laser annealing process to the first annealing condition, the number of processes can be reduced.

[Embodiment 9]

In embodiment 9 a case of manufacturing TFTs by a different process order from that of embodiment 1 is described by using FIGS. 11A to 11E. Note that because only a part of the way is different from embodiment 1 and others are similar, same reference numerals are used for the same process. The example is given by the same impurity element as embodiment 1 for the impurity elements doped.

First, a base film 101 is formed on a substrate 100 according to embodiment 1 and a semiconductor film comprising amorphous component is formed thereon.

Figure 11A:
FIG. 11 shows a manufacturing method of AM-LCD.

In embodiment 9, amorphous silicon film 1101 is formed into 30 nm thickness by CVD. (FIG. 11A)

Figure 11B:
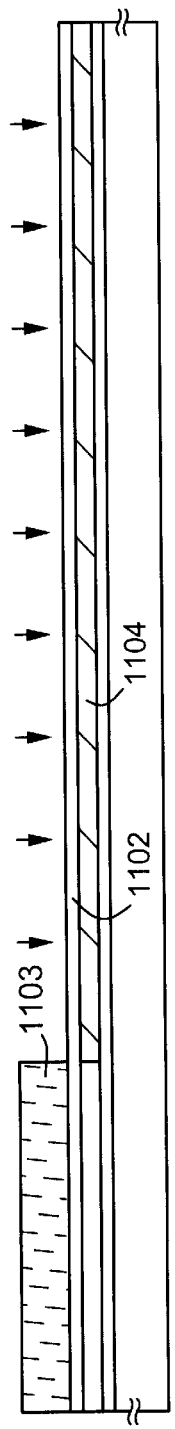

A protection film 1102 comprising an insulating film comprising silicon is formed into 120 to 150 nm, and a resist mask 1103 is formed. Channel doping process under the same conditions as FIG. 1C is performed. P-type impurity region (b) 1104 is thus formed. (FIG. 11B)

Figure 11C:
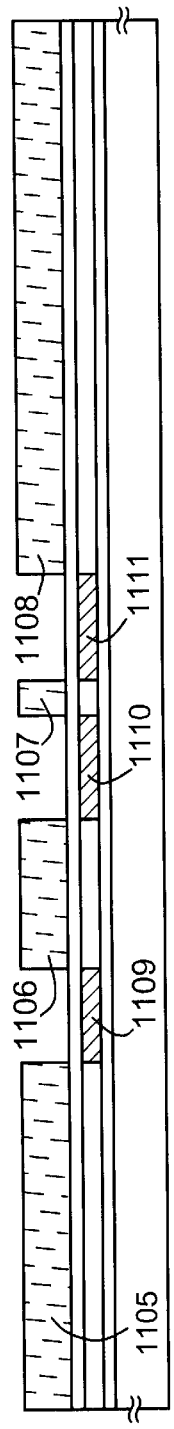

Resist mask 1103 is then removed, and new resist masks 1106 to 1108 are formed. N-type impurity element is doped under the same conditions as FIG. 1D. N-type impurity regions (b) 1109 to 1111 are thus formed. (FIG. 11C)

Figure 11D:
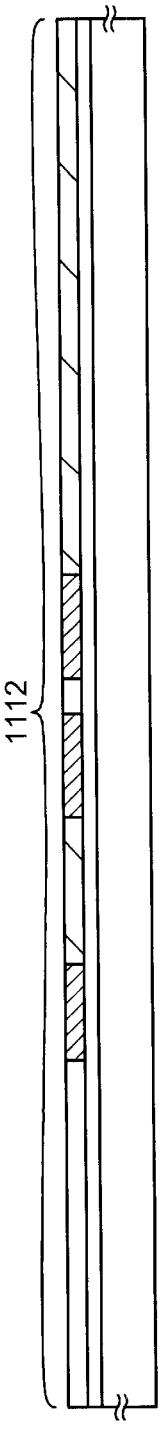

After removing protection film 1102, non-crystalline silicon film doped with n-type or p-type impurity element is crystallized according to the technology disclosed in Japanese Patent Application Laid-Open No. Hei 7-130652 and crystalline silicon film 1112 is obtained. (FIG. 11D)

Note that it is possible to leave the protection film 1102 as it is when performing crystallization using the technology disclosed in Embodiment 2 of the above stated Japanese Patent Application Laid-Open No. Hei 7-130652. Namely, it is possible to use the protection film as a mask film for selectively doping catalyst element that promotes crystallization.

Figure 11E:
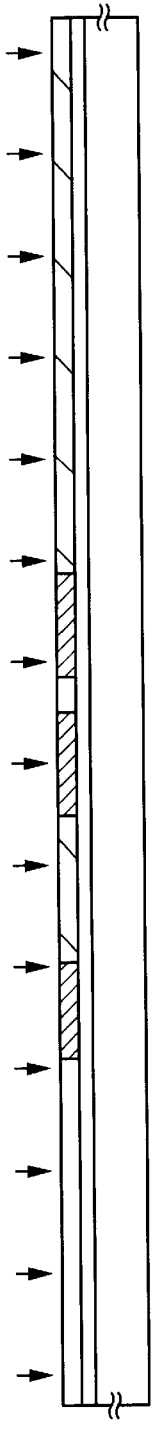

The laser annealing process under the same conditions as FIG. 1B (the first annealing condition) is next performed. In this process, crystallinity of the crystalline silicon film that is not doped with impurity element is improved, and the doped n-type or p-type impurity elements are activated as well as recrystallizing the silicon film that became amorphous in the regions that was doped with impurity elements. Note that this process may preferably be performed after removing thermal oxidation film formed on the surface of crystalline silicon film 1112 formed in the crystallization process of FIG. 11D. (FIG. 11E)

Hereafter, the processes after FIG. 1F may be performed according to embodiment 1. Note that it is possible to apply the structure of embodiment 9 in forming active matrix liquid crystal display device of embodiment 2. Further, it is possible to combine embodiment 9 with embodiment 3.

[Embodiment 10]

In embodiment 10 a case of manufacturing TFTs by a different process order from that of embodiment 1 is described. Note that only a part of the way is different from embodiment 1 and others are similar. The example is given by the same impurity element as embodiment 1 for the impurity elements doped.

The state of FIG. 11A is obtained according to the processes of embodiment 9. Next, after forming a protection film comprising an insulating film comprising silicon into a thickness of 120 to 150 nm, resist mask is formed. N-type impurity element is then doped under the same condition as FIG. 1D. N-type impurity region (b) is thus formed.

Resist mask is removed next, and a new resist mask is formed. Channel doping process is performed under the same conditions as FIG. 1C. P-type impurity region (b) is formed.

After removing the protection film, non-crystalline silicon film doped with n-type or p-type impurity element is crystallized according to the technology disclosed in Japanese Patent Application Laid-Open No. Hei 7-130652, and a crystalline silicon film is obtained.

Processes after FIG. 11E may be performed hereafter according to embodiment 9. Note that it is possible to apply the structure of embodiment 10 in forming active matrix liquid crystal display device of embodiment 2. Further, it is possible to combine embodiment 10 with embodiment 3.

[Embodiment 11]

In embodiment 11 a case of manufacturing TFTs by a different process order from that of embodiment 1 is described by using FIGS. 12A to 12F. Note that because only a part of the way is different from embodiment 1 and others are similar, same reference numerals are used for the same process. The example is given by the same impurity element as embodiment 1 for the impurity elements doped.

According to processes of embodiment 1, the state of FIG. 1C is obtained. (FIGS. 12A to 12C) Here, a laser annealing process under the same conditions as FIG. 1E (the second annealing condition) may be performed to activate the p-type impurity elements doped in the channel doping process.

Next, the crystalline silicon film is patterned to form active layers 1201 to 1204. A gate insulating film 1205 is formed thereon in 80 to 150 nm thickness (110 nm in embodiment 11). An insulating film comprising silicon may be used as the gate insulating film 1205. Oxidized silicon nitride film is used in embodiment 11. (FIG. 12D)

Resist masks 1206 to 1209 are next formed. N-type impurity elements are doped similarly to FIG. 1D. Provided, it is necessary to set a different acceleration voltage from FIG. 1D when doping the impurity element through an insulating film having different thickness. N-type impurity regions (b) 1210 to 1212 are thus formed. (FIG. 12E)

Resist masks 1206 to 1209 are next removed and a laser annealing process (the second annealing condition) is performed. N-type or p-type impurity element doped is effectively activated by this process. At the same time, the interface between active layers and a gate insulating film is also improved. Note that in embodiment 11 the laser annealing conditions must be set so as to irradiate the laser light through a gate insulating film having 110 nm thickness. (FIG. 12F)

Processes after FIG. 2B may be performed according to processes of embodiment 1 hereafter. Note that it is possible to apply the structure of embodiment 11 in forming active matrix liquid crystal display device of embodiment 2. Further, it is possible to combine embodiment 11 with embodiment 3.

[Embodiment 12]

In embodiment 12 a case of manufacturing TFTs by a different process order from that of embodiment 1 is described. Note that only a part of the way is different from embodiment 1 and others are similar. The example is given by the same impurity element as embodiment 1 for the impurity elements doped.

Processes through the process of FIG. 1B are performed according to embodiment 1. The state of FIG. 9A is obtained according to processes of embodiment 5. While the embodiment 12 shows an example of patterning the crystalline silicon film after laser annealing process (the first annealing process), it is possible to conduct these processes in reverse order. Next, after forming a mask, channel forming process is performed. Note that embodiment 12 shows an example of performing channel doping process after active layer formation process, but it is possible to perform these processes in the reverse order.

Hereafter processes of FIGS. 12E to 12F are performed, and processes onward may be performed according to processes of embodiment 1.

Note that it is possible to apply the structure of embodiment 12 in forming active matrix liquid crystal display device of embodiment 2. Further, it is possible to combine embodiment 12 with embodiment 3.

[Embodiment 13]

In embodiment 13 a case of manufacturing TFTs by a different process order from that of embodiment 1 is described. Note that only a part of the way is different from embodiment 1 and others are similar. The example is given by the same impurity element as embodiment 1 for the impurity elements doped.

The processes through FIG. 1A are performed according to embodiment 1, and laser annealing process (the first annealing condition) according to embodiment 7 is performed. Active layers are then formed by patterning crystalline silicon film on which laser annealing process (the first annealing condition) is performed.

While the embodiment 13 showed an example of patterning the crystalline silicon film after laser annealing process (the first annealing condition), it is possible to perform these processes in the reverse order.

A gate insulating film is then formed in the similar way as the process of FIG. 12D described in embodiment 11. Thereafter processes of FIG. 12D to 12F are performed according to embodiment 11, and processes FIG. 2B onward may be performed according to embodiment 1. Note that it is possible to apply the structure of embodiment 13 in forming active matrix liquid crystal display device of embodiment 2. Further, it is possible to combine embodiment 13 with embodiment 3.

Further, a laser annealing process (the first annealing condition) may be omitted and be combined with a laser annealing process performed after forming the impurity region (b). In this case, it is necessary to alter the conditions for the laser annealing process to the first annealing condition, but this may reduce the number of processes. Provided, because it is necessary to irradiate the laser light through a gate insulating film of 110 nm thickness in embodiment 13, the laser annealing conditions must be set by taking that in mind.

[Embodiment 14]

In embodiment 14 a case of manufacturing TFTs by a different process order from that of embodiment 1 is described. Note that only a part of the way is different from embodiment 1 and others are similar. The example is given by the same impurity element as embodiment 1 for the impurity elements doped.

The state of FIG. 11B is obtained by following the steps of embodiment 9. (FIGS. 11A and 11B) Resist mask 1103 is then removed, and the amorphous silicon film doped with n-type or p-type impurity element is crystallized according to the technology described in Japanese Patent Application Laid-Open No. Hei 7-130652 in order to obtain crystalline silicon film.

Note that it is possible to leave the protection film 1102 remained when performing crystallization using the technology described in the Embodiment 2 of Japanese Patent Application Laid-Open No. Hei 7-130652. Namely, the protection film can be used as a mask film in selectively doping catalytic element promoting crystallization.

A laser annealing process under the same conditions as FIG. 1B (the first annealing condition) is next performed. In this process, crystallinity is improved in the crystalline silicon film that is not doped with impurity elements, whereas doped n-type or p-type impurity elements are activated as well as the silicon film that became amorphous is recrystallized in the region where impurity elements are doped.

Thereafter processes of FIGS. 12D to 12F are performed according to embodiment 11 and then the processes FIG. 2B onward may be performed by following the steps of embodiment 1. Note that it is possible to apply the structure of embodiment 14 in forming active matrix liquid crystal display device of embodiment 2. Further, it is possible to combine embodiment 14 with embodiment 3.

Further, the structure of embodiment 14 may be such that the channel doping process of is replaced by performing doping to form n-type impurity region (b).

[Embodiment 15]

In embodiment 15 a case of manufacturing TFTs by a different process order from that of embodiment 1 is described by using FIGS. 13A to 13F. Note that because only a part of the way is different from embodiment 1 and others are similar, same reference numerals are used for the same process. The example is given by the same impurity element as embodiment 1 for the impurity elements doped.

Figure 13A:
FIG. 13 shows a manufacturing method of AM-LCD.
Figure 13B:
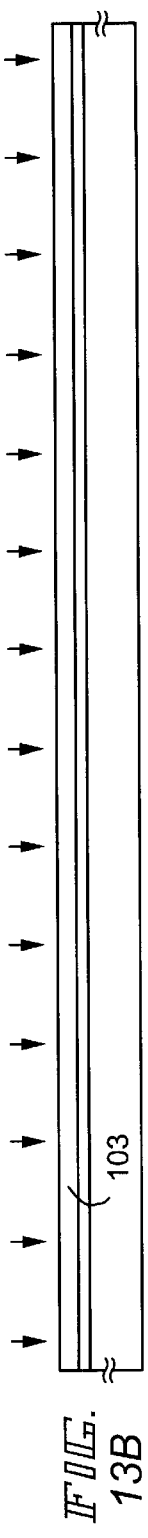
Figure 13C:
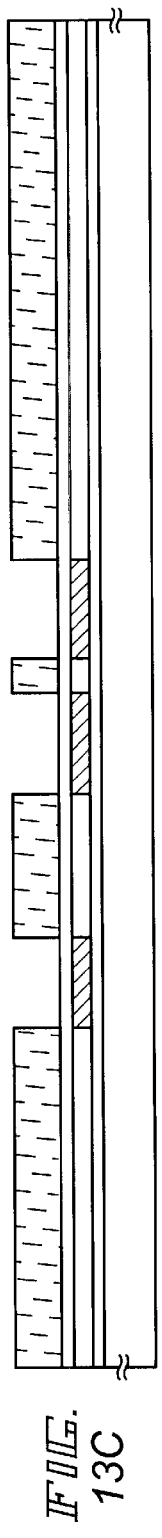

The state of FIG. 1B is obtained following the steps of embodiment 1. (FIGS. 13A and 13B) Further, the state of FIG. 13C is obtained according to embodiment 4. Here, laser annealing process under the same conditions as FIG. 1E (the second annealing condition) may be performed to activate the n-type impurity element doped in the process of FIG. 13C.

Figure 13D:
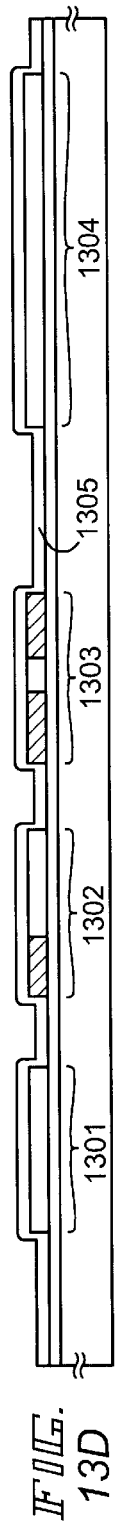

Active layers 1301 to 1304 are next formed by patterning the crystalline silicon film. A gate insulating film 1305 is then formed thereon into 80 to 150 nm (110 nm in embodiment 15) thickness. An insulating film comprising silicon may be used as the gate insulating film 1305, and oxidized silicon nitride film is used in embodiment 15. (FIG. 13D)

Figure 13E:
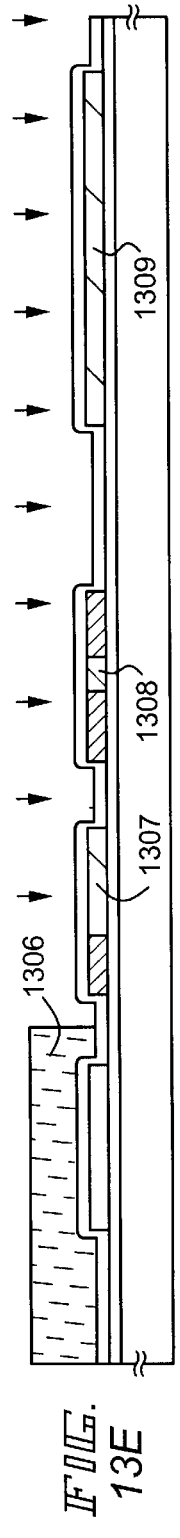

A resist mask 1306 is next formed. P-type impurity element is doped in the similar way as FIG. 1C. Provided, it is necessary to set the acceleration voltage differing from the case of FIG. 1C when the impurity element is doped through an insulating film having a different film thickness. P-type impurity regions (b) 1307 to 1309 are thus formed. (FIG. 13E)

Figure 13F:
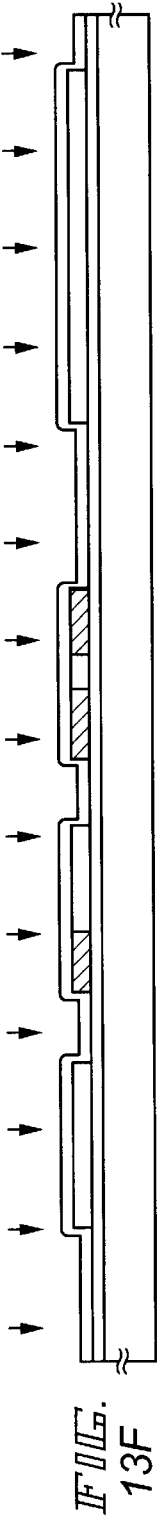

Resist mask 1306 is then removed, and a laser annealing process (the second annealing condition) is performed. By this process doped n-type or p-type impurity element is effectively activated. At the same time the interface between the active layers and a gate insulating film is improved. Note that it is necessary to irradiate the laser light through the gate insulating film of 110 nm thick, and the laser annealing conditions must be set taking that in mind. (FIG. 13F)

Thereafter the processes of FIG. 2B onward may be performed by following the steps of embodiment 1. Note that it is possible to apply the structure of embodiment 15 in forming active matrix liquid crystal display device of embodiment 2. Further, it is possible to combine embodiment 15 with embodiment 3.

[Embodiment 16]

In embodiment 16 a case of manufacturing TFTs by a different process order from that of embodiment 1 is described. Note that only a part of the way is different from embodiment 1 and others are similar. The example is given by the same impurity element as embodiment 1 for the impurity elements doped.

The processes through FIG. 1B are performed by following the steps of embodiment 1, and the state of FIG. 9B is obtained according to embodiment 5. While the embodiment 16 shows an example of patterning the crystalline silicon film after laser annealing process (the first annealing condition), it is possible to perform the processes in the reverse order. Further the n-type impurity region (b) is formed after forming the active layers in embodiment 16 but it is possible to perform the processes in the reverse order.

Processes of FIGS. 13D to 13F are performed according to embodiment 15 and then the processes of FIG. 2B onward may be performed by following the steps of embodiment 1. Note that it is possible to apply the structure of embodiment 16 in forming active matrix liquid crystal display device of embodiment 2. Further, it is possible to combine embodiment 16 with embodiment 3.

[Embodiment 17]

In embodiment 17 a case of manufacturing TFTs by a different process order from that of embodiment 1 is described. Note that only a part of the way is different from embodiment 1 and others are similar. The example is given by the same impurity element as embodiment 1 for the impurity elements doped.

First a processes through FIG. 11A are performed by following the steps of embodiment 1, and then the state of FIG. 10B is obtained by the processes of embodiment 8. While embodiment 17 shows an example of performing patterning the crystalline silicon film after laser annealing process (the first annealing condition), it is possible to perform the processes in the reverse order.

Thereafter the processes of FIGS. 13D to 13F are performed according to embodiment 15, and then the processes FIG. 2B onward may be performed by following the steps of embodiment 1. Note that it is possible to apply the structure of embodiment 17 in forming active matrix liquid crystal display device of embodiment 2. Further, it is possible to combine embodiment 17 with embodiment 3.

Further, the laser annealing process (the first annealing condition) may be omitted and be combined with the laser annealing process that is performed after forming n-type impurity region (b). In this case it is necessary to alter the laser annealing process conditions to the first annealing condition, but it becomes possible to reduce the number of processes. Provided it is necessary to irradiate the laser light through the gate insulating having a thickness of 110 nm and the laser annealing conditions must be set to have that in mind.

[Embodiment 18]

In embodiment 18 a case of manufacturing TFTs by a different process order from that of embodiment 1 is described. Note that only a part of the way is different from embodiment 1 and others are similar. The example is given by the same impurity element as embodiment 1 for the impurity elements doped.

The processes through FIG. 1B are performed according to embodiment 1, and the crystalline silicon film 103 is patterned to form active layers 901 to 904, in the similar way as the embodiment 5 (FIG. 9A). While the embodiment 18 shows an example of patterning the crystalline silicon film after laser annealing process (the first annealing condition), it is possible to perform these processes in the reverse order.

A gate insulating film 905 is then formed thereon into 80 to 150 nm thickness (110 nm in embodiment 18). An insulating film comprising silicon may be used as the gate insulating film. In embodiment 18 oxidized silicon nitride film is used.

Resist mask is then formed. N-type impurity region is doped in the similar way as FIG. 1D. Provided, it is necessary to set the acceleration voltage differently from FIG. 1D in case the impurity element is doped through an insulating film of a different film thickness. N-type impurity region (b) is thus formed.

The resist mask is removed, and a new resist mask is formed. A channel doping process is then performed in the same conditions as in FIG. 1C. Provided, it is necessary to set the acceleration voltage differently from FIG. 1C in case the impurity element is doped through an insulating film of a different film thickness. P-type impurity region (b) is thus formed.

The resist mask is next removed and a laser annealing process (the second annealing condition) is performed. By this process the doped n-type or p-type impurity element is effectively activated. At the same time the interface between the active layers and a gate insulating film is improved. Note that it is necessary to irradiate the laser light through the gate insulating having a thickness of 1 nm in embodiment 18 and the laser annealing conditions must be set taking that in mind.

Thereafter the processes FIG. 2B onward may be performed by following the steps of embodiment 1. Note that it is possible to apply the structure of embodiment 18 in forming active matrix liquid crystal display device of embodiment 2. Further, it is possible to combine embodiment 18 with embodiment 3.

Further, the laser annealing process (the first annealing condition) may be omitted and be combined with the laser annealing process that is performed after forming n-type impurity region (b). In this case it is necessary to alter the laser annealing process conditions to the first annealing condition, but it becomes possible to reduce the number of processes. Provided it is necessary to irradiate the laser light through the gate insulating having a thickness of 110 nm and the laser annealing conditions must be set to have that in mind.

[Embodiment 19]

In embodiment 19 a case of manufacturing TFTs by a different process 15, order from that of embodiment 1 is described by using FIGS. 14A to 14E. Note that because only a part of the way is different from embodiment 1 and others are similar, same reference numerals are used for the same process. The example is given by the same impurity element as embodiment 1 for the impurity elements doped.

First up to FIG. 2B is formed by following the steps of embodiment 1. The figure that corresponds to FIG. 2B is FIG. 14A.

After forming resist masks 816 to 820, gate wirings 821 to 824 and a wiring are formed by etching the first high melting point metal film 119 and the second high melting point metal film 120 in a single step. Here, the gate wirings 822 and 823 formed in the driver circuit are formed to overlap a portion of n-type impurity regions (b) 111 to 113 by interposing a gate insulating film. The overlapped portions will later become Lov regions. (FIG. 14B) N-type impurity element (phosphorus in embodiment 19) is next doped in a self-aligned manner using the gate wirings 821 to 824 as masks. At this time, the impurity was doped with resist masks 816 to 820 that are used for forming the wiring and the gate wirings, remained. Thus formed impurity regions 825 to 830 are adjusted to be doped with phosphorus at ½ to ¹⁄₁₀ (typically ⅓ to ¼) of concentration in that of the n-type impurity region (b). (FIG. 14C)

Strictly speaking however, among the n-type impurity regions (b) 111 to 113, while the phosphorus concentration in the portions that overlaps with gate wirings remain at $2\times10^{16}$ to $5\times10^{19}$ atoms/cm$^3$, the portions that do not overlap the gate wirings are doped with phosphorus at concentration of $1\times10^{16}$ to $5\times10^{18}$ atoms/cm$^3$, and the portions that overlaps with gate wirings include phosphorus at a more or less higher concentration.

By thus exposing the active layer, the acceleration voltage for performing next impurity element can be set low. Therefore throughput may be improved because the necessary dose amount is low. Needless to say, the impurity regions may be formed by doping with exposing the active layers.

Resist masks 836 to 838 are next formed to cover the gate wirings, and impurity regions 839 to 847 containing phosphorus at a high concentration are formed by adding n-type impurity element (phosphorus in embodiment 19). (FIG. 14D)

Resist mask 848 is formed to cover the n-channel TFT and impurity regions 849 and 850 that includes boron at a high concentration by adding p-type impurity element (boron in embodiment 19).

Note that while the Embodiment 19 used masks comprising photosensitive resin such as resist exposed to light by using photo-masks for masks 816 to 820, 836 to 838 and 848, these may be masks formed by silicon as its main component patterned by resist masks etc. Provided, masks 816 to 820, 836 to 838 and 848 require a film thickness sufficient to prevent penetration of oxygen ion etc. into the gate electrode.

Thereafter the processes of FIG. 3C onward may be performed by following the steps of embodiment 1. Note that it is possible to apply the structure of embodiment 19 in forming active matrix liquid crystal display device of embodiment 2. Further, it is possible to combine embodiment 19 with embodiment 3.

[Embodiment 2]

In embodiment 20 a case of manufacturing TFTs by a different process order from that of embodiment 1 is described by using FIGS. 15A to 17C. Note that because only a part of the way is different from embodiment 1 and others are similar, same reference numerals are used for the same process. The example is given by the same impurity element as embodiment 1 for the impurity elements doped.

First, up to FIG. 1D is formed by following the steps of embodiment 1. The figures corresponding to FIGS. 1A to 1D are FIGS. 15A to 15D respectively.

Resist masks 1501 to 1503 are next formed and impurity elements imparting p-type (hereinafter referred to as p-type impurity element) is added by interposing the protection film 104, and impurity regions including boron at a high concentration 1504 and 1505 are formed. (FIG. 15E)

The protection film 104 is next removed, and laser light irradiation process is performed again. This laser light irradiation process has its object in activation of doped impurity element, and it is preferable that the light be irradiated at an energy that do not melt the crystalline silicon film. Further, it is possible to perform laser annealing process with the protection film 104 remained. (FIG. 16A)

Next unnecessary portions of the crystalline silicon film are removed, and island semiconductor layers (hereinafter referred to as active layers) 115 to 117 and 1506 are formed in the similar way as in embodiment 1. (FIG. 16B)

A gate insulating film 118 is next formed to cover the active layers 114 to 117 in the similar way as in embodiment 1. (FIG. 16C)

Next, high melting point metal film that will later become gate wiring is formed in the similar way as in embodiment 1. In embodiment 20, 50 nm thickness tungsten nitride (WNx) film is used as the first high melting point metal film 119, and 350 nm thick tungsten film, as the second high melting point metal film 120. (FIG. 16D)

Resist masks 1507 to 1511 are then formed, and the first high melting point metal 119 and the second high melting point metal film 120 are etched by a step to form gate wirings 1513 to 1516 and wiring 1512 into 400 nm thick. At this time, gate wirings 1509 and 1510 are formed to overlap with a portion of n-type impurity region (b) through a gate insulating film (FIG. 16E)

Next n-type impurity element (phosphorus in embodiment 20) is doped in a self-aligned manner by using the gate wirings 1513 to 1516 as masks. Thus formed impurity regions 1517 to 1522 are adjusted to be doped with phosphorus at concentration of ½ to ¹⁄₁₀ (typically ⅓ to ¼) that of the n-type impurity regions (b). (FIG. 16F)

Figure 17A:
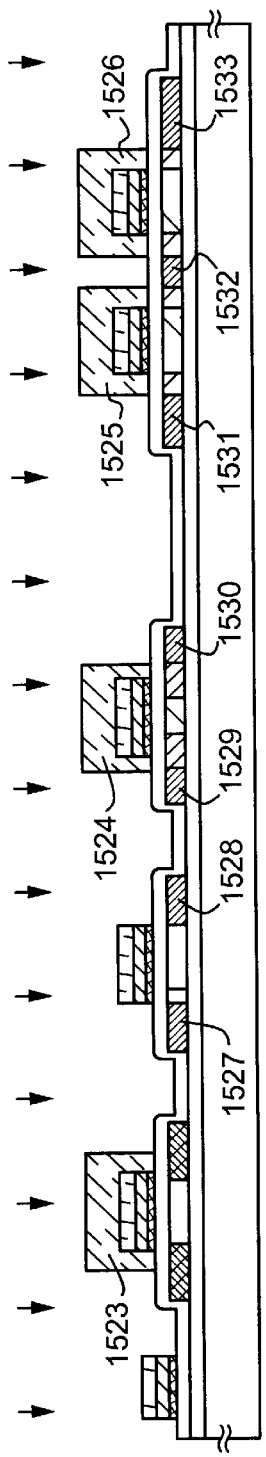
FIG. 17 shows a manufacturing method of AM-LCD.

New resist masks 1523 to 1526 are formed by remaining resist masks 1507 to 1511, and impurity regions 1527 to 1533 that include phosphorus at a high concentration are formed by doping n-type impurity element (phosphorus in embodiment 20). Needless to say, the impurity elements may be formed by exposing the active layers by etching the gate insulating film. Here too ion doping using phosphine (PH$_3$) was performed, and the phosphorus concentration in those regions are set at $1\times10^{20}$ to $1\times10^{21}$ atoms/cm$^3$ (typically $2\times10^{20}$ to $5\times10^{20}$ atoms/cm$^3$). (FIG. 17A)

An example of performing ion doping by remaining resist masks on the gate electrodes are shown for the formation of the impurity regions. However, the masks may by masks comprising silicon as its main component patterned by using masks etc., in place of resist masks. Provided, these masks require film thickness to prevent penetration of oxygen etc. into the gate electrodes. The mask comprising silicon as its main component may be a silicon nitride film, a silicon oxide film, an oxidized silicon nitride film or a laminate of these.

After removing resist masks 1507 to 1511 and 1523 to 1526, an insulating film 151 that forms a part of the first interlayer insulating film is formed in the similar way as embodiment 1.

Figure 17B:
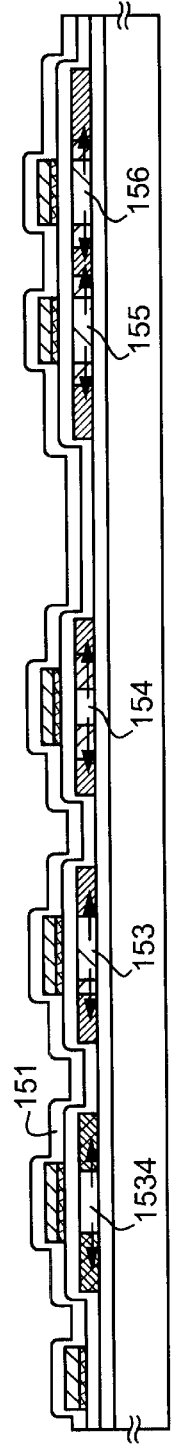
Figure 17C:
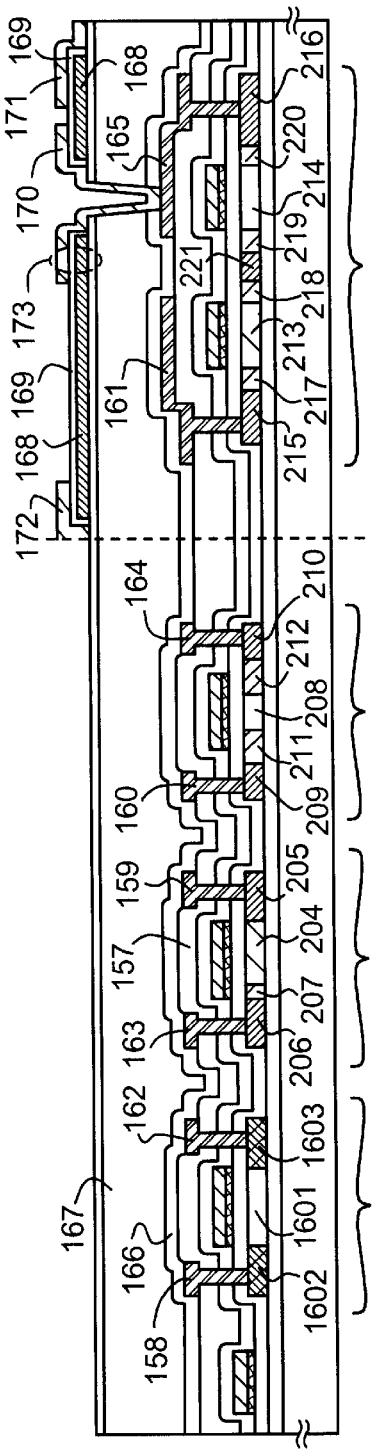
Figure 18A:
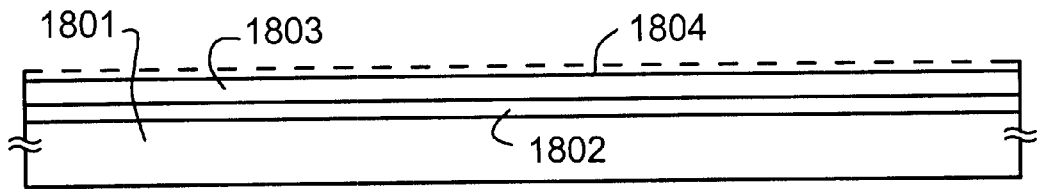
FIG. 18 is a diagram showing a cross section showing manufacturing process of crystalline semiconductor film.
Figure 18B:
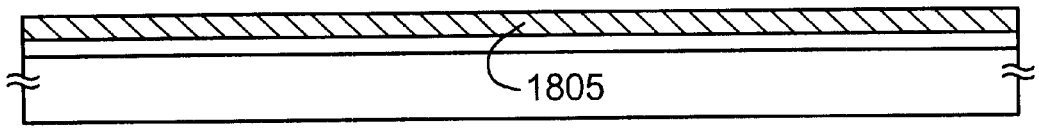
Figure 18C:
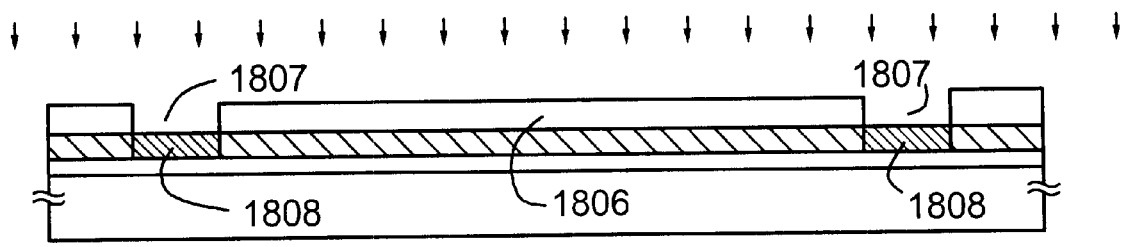
Figure 18D:
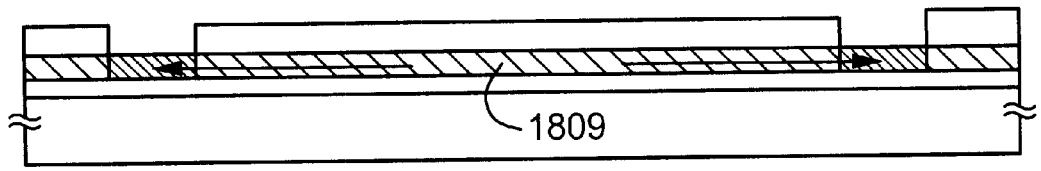

Thereafter in the similar way as in embodiment 1, heat treatment process was performed to activate the n-type or p-type impurity elements doped in respective concentrations. (FIG. 17B)

Here, catalytic element used for the crystallization of amorphous silicon, film in embodiment 20 (nickel in embodiment 20) moved in a direction shown by an arrow, and is captured (gettering) in the region that contain phosphorus at a high concentration, formed in the above stated process. This is a phenomenon originated in the gettering effect of metal element by phosphorus. As a result, the concentration of the catalytic element contained in regions 1534 and 153 to 156 that will later become channel forming regions became $1\times10^{17}$ atoms/cm$^3$ or less (preferably $1\times10^{16}$ atoms/cm$^3$ or less).

Further, a process for hydrogenating the active layers was conducted by performing heat treatment at 300 to 450° C. for 1 to 12 hours in an atmosphere containing 3 to 100% hydrogen. This process is for terminating dangling bonds in the semiconductor layer, by thermally excited hydrogen. As another means for hydrogenation, plasma hydrogenation (that uses hydrogen excited by plasma) may be performed.

After the activation process, the processes of FIG. 3C onward may be performed by following the steps of embodiment 1. In embodiment 20, adhesiveness between shielding film 168 and interlayer insulating film 167 was improved by forming a thin silicon oxide film 174 by sputtering, after forming interlayer insulating film 167. The silicon oxide film 174 may be formed into a same pattern by etching. Note that it is possible to apply the structure of embodiment 20 in forming active matrix liquid crystal display device of embodiment 2. Further, it is possible to combine embodiment 20 with embodiment 3.

[Embodiment 2]

The process for fabricating a semiconductor film which forms an active layer of a TFT is described in embodiment 21 by using FIGS. 18A to 18D. The crystallization method of embodiment 21 is a technology described in embodiment 1 of Japanese Patent Application Laid-Open No. Hei 7-130652.

First, a base film 1802 comprising an oxidized silicon nitride film of 200 nm thickness is formed over a substrate (a glass substrate in embodiment 21) 1801 and an amorphous semiconductor film (an amorphous silicon film in embodiment 21) is formed thereon. In this process, the base film and amorphous semiconductor film may be continuously formed without exposure to the atmosphere.

Next, an aqueous solution (nickel acetate solution in embodiment 21) containing 10 ppm by weight of a catalytic element (nickel in embodiment 21) is applied by spin coating, forming a catalytic element containing layer 1804 on the entire surface of the amorphous semiconductor film 1803. In addition to nickel (Ni), it is possible to use the following elements as the catalytic element here: germanium (Ge), iron (Fe), palladium (Pd), tin (Sn), lead (Pb), cobalt (Co), platinum (Pt), copper (Cu), and gold (Au). (See FIG. 18A.)

A nickel doping method by spin coating is used in embodiment 21, but a thin film may also be formed from the catalytic element (a nickel film in the case of embodiment 21) on the amorphous semiconductor film by a means such as evaporation or sputtering.

A heat treatment process at 400 to 500° C. for approximately 1 hour is performed preceding a crystallization process, and after removing hydrogen from within the film, heat treatment is performed at between 500 and 650° C. (preferably from 550 to 570° C.) for 4 to 12 hours (preferably between 4 and 6 hours). Heat treatment is performed at 550° C. for 4 hours in embodiment 21, forming a crystalline semiconductor film (a crystalline silicon film in embodiment 21) 1805. (See FIG. 18B.)

Note that the crystallinity of crystalline semiconductor film 1805 may be improved by a laser annealing process (the first annealing condition) similar to that of FIG. 1E, embodiment 1.

A gettering process for removing the nickel used in the crystallization process from the crystalline silicon film is performed next. First, a mask insulating film 1806 is formed to a thickness of 150 nm on the surface of the crystalline semiconductor film 1805, and an open section 1807 is formed by patterning. A process for doping a periodic table group 15 element (phosphorous in embodiment 21) into the exposed crystalline semiconductor film is then performed. A gettering region 1808 containing a phosphorous concentration of between $1 \times 10^{19}$ and $1 \times 10^{20}$ atoms/cm$^3$ is thus formed. (See FIG. 18C.)

A heat treatment process is performed next in a nitrogen atmosphere at between 450 and 650° C. (preferably from 500 to 550° C.) for 4 to 24 hours (preferably between 6 and 12 hours). The nickel in the crystalline semiconductor film is made to move in the direction of the arrows by this heat treatment process, and is captured in the gettering region 1808 by a phosphorous gettering effect. In other words, the concentration of nickel contained in a crystalline semiconductor film 1809 can be reduced below $1 \times 10^{17}$ atoms/cm$^3$, preferably to $1 \times 10^{16}$ atoms/cm$^3$, because nickel is removed from the crystalline semiconductor film. (See FIG. 18D.)

By using the catalytic element to promote crystallization (nickel here), the crystalline semiconductor film 1809 thus formed is a crystalline semiconductor film having extremely good crystallinity. Further, the catalytic element is removed by the phosphorous gettering effect after crystallization, and the concentration of the catalytic element remaining in the crystalline semiconductor film 1809 (provided excluding gettering regions) is less than $1 \times 10^{17}$ atoms/cm$^3$, preferably $1 \times 10^{16}$ atoms/cm$^3$.

The embodiment 21 is characterized in: forming a gettering region (a region containing impurity element belonging to group 15 element at a high concentration) in a region that is not used as an active layer after forming a crystalline semiconductor film crystallized by using a catalytic element, and gettering the catalytic element used for crystallization by heat treatment.

Note that it is possible to freely combine the structure of embodiment 21 with the structure of any of embodiments 1 to 20.

[Embodiment 22]

FIGS. 19A to 19D is used in embodiment 22 to explain the formation process of a semiconductor film that becomes a TFT active layer. Specifically, the technique described in Japanese Patent Application Laid-open No. Hei 10-247735 (corresponding to U.S. Pat. No. 09/034,041) is used.

First, a base film 1902 is formed from a 200 nm thick nitrated silicon oxide film on a substrate (a glass substrate in embodiment 22) 1901 and an amorphous semiconductor film (an amorphous silicon film in embodiment 22) 1903 with a 200 nm thickness. This process may be performed by continuously forming the base film and the amorphous semiconductor film with out exposure to the atmosphere.

A mask insulating film 1904 is then formed from a silicon oxide film to a thickness of 200 nm, and an open section 1905 is formed.

Next, an aqueous solution containing 100 ppm by weight of a catalytic element (nickel in embodiment 22) is applied by spin coating, forming a catalytic element containing layer 1906. The catalytic element containing layer 1906 is selectively in contact with the amorphous semiconductor film 1903 at this point in the region where the open section 1905 is formed. In addition to nickel (Ni), it is possible to use the following elements as the catalytic element here: germanium (Ge), iron (Fe), palladium (Pd), tin (Sn), lead (Pb), cobalt (Co), platinum (Pt), copper (Cu), and gold (Au). (See FIG. 19A.)

A nickel doping method by spin coating is used in embodiment 22, but a thin film may also be formed from the catalytic element (a nickel film in the case of embodiment 22) on the amorphous semiconductor film by a means such as evaporation or sputtering.

A heat treatment process at 400 to 500° C. for approximately 1 hour is performed preceding a crystallization process, and after removing hydrogen from within the film, heat treatment is performed at between 500 and 650° C. (preferably from 550 to 600° C.) for 6 to 16 hours (preferably between 8 and 14 hours). Heat treatment is performed at 570° C. for 14 hours in embodiment 22. As a result, crystallization proceeds roughly parallel to the substrate (in the direction shown by the arrows) with the open section 1905 as a starting point, forming a crystalline semiconductor film (a crystalline silicon film in embodiment 22) 1907, in which the growth directions of the crystals are macroscopically in alignment. (See FIG. 19B.)

A gettering process for removing the nickel used in the crystallization process from the crystalline silicon film is performed next. A process for doping a periodic table group 15 element (phosphorous in embodiment 22) is performed with the mask insulating film 1904 previously formed as a mask as it is, a gettering region 1908 containing a phosphorous concentration of between $1\times10^{19}$ and $1\times10^{20}$ atoms/cm$^3$ in the crystalline semiconductor film exposed by the open section 1905 is formed. (See FIG. 19C.)

A heat treatment process is performed next in a nitrogen atmosphere at between 450 and 650° C. (preferably from 500 to 550° C.) for 4 to 24 hours (preferably between 6 and 12 hours). The nickel in the crystalline semiconductor film is made to move in the direction of the arrows by this heat treatment process, and is captured in the gettering region 1908 by a phosphorous gettering effect. In other words, the concentration of nickel contained in a crystalline semiconductor film 1909 can be reduced below $1\times10^{17}$ atoms/cm$^3$, preferably to $1\times10^{16}$ atoms/cm$^3$, because nickel is removed from the crystalline semiconductor film. (See FIG. 19D.)

By selectively doping the catalytic element to promote crystallization (nickel here) and then performing crystallization, the crystalline semiconductor film 1909 thus formed is a crystalline semiconductor film having extremely good crystallinity. Specifically, it has a crystal structure in which bar-like or column-like crystals are lined up with a fixed directionality. Additionally, the lo catalytic element is removed by the phosphorous gettering effect after crystallization, and the concentration of the catalytic element remaining in the crystalline semiconductor film 1909 is less than $1\times10^{17}$ atoms/cm$^3$, preferably $1\times10^{16}$ atoms/cm$^3$.

The embodiment 22 is characterized in: forming a gettering region (a region containing impurity element belonging to periodic table group 15 element at a high concentration) in a region that is not used as an active layer after forming a crystalline semiconductor film crystallized by using a catalytic element, and gettering the catalytic element used for crystallization by heat treatment.

Note that it is possible to freely combine the structure of embodiment 22 with the structure of any of embodiments 1 to 21.

[Embodiment 23]

Examples of various wiring structures formed on an insulating surface using the present invention are shown in FIGS. 20A to 20F. A cross sectional view of a single layered wiring comprising a material having tungsten as a main component 1701 formed on a film having an insulating surface (or a substrate) 1700 in FIG. 20A. This wiring is patterned from a film formed by using a target having a purity of 4N or over, and a sputtering gas of simple substance selected from argon (Ar), krypton (Kr), Xenon (Xe) etc. or a mixed gas of these. Note that a sputtering power, gas pressure, substrate temperature etc. may be controlled by the operator.

The wiring 1701 thus obtained include scarcely no impurity element, specifically amount of oxygen contained is 30 ppm or lower. The electric resistivity is 20 $\mu\Omega$·cm or lower, typically 6 to 15 $\mu\Omega$·cm. The stress of the film is $-5\times10^9$ to $5\times10^9$ dyn/cm$^2$.

Figure 20A:
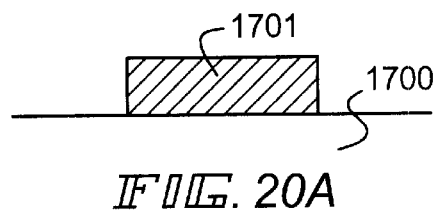
FIG. 20 is a cross sectional view showing a wiring structure.
Figure 20B:
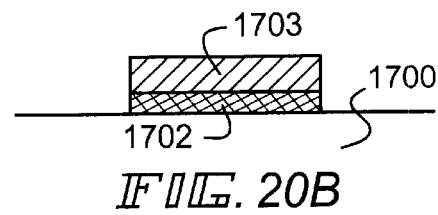

FIG. 20B shows a double layered structure similar to that of embodiment 1 Tungsten nitride (WNx) is formed as a lower layer, and tungsten, upper layer. The tungsten nitride film 1702 may be formed into 10 to 50 nm (preferably 10 to 30 nm) and tungsten film 1703 may be formed into 200 to 400 nm (preferably 250 to 350 nm). The films are continuously formed in a laminate by sputtering in embodiment 23 without exposure to the atmosphere.

Figure 20C:
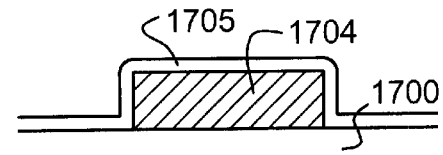

FIG. 20C is an example in which a wiring 1704 comprising a material formed from tungsten as a main component is formed on a film having insulating surface (or a substrate) 1700, and is covered by an insulating film 1705. The insulating film 1705 may be formed from silicon nitride film, silicon oxide film, silicon oxynitride film SiOxNy (0<xx, y<1) or a laminate combining these films.

Figure 20D:
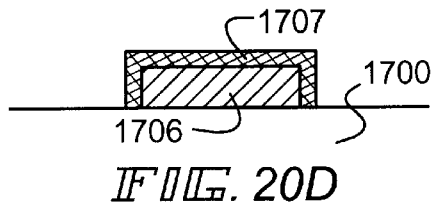

FIG. 20D is an example in which a wiring 1706 comprising a material having tungsten as a main component, formed on a film having an insulating surface (or a substrate) 1700, is covered by a tungsten nitride film 1707 on the surface. Note that a structure of FIG. 20D is obtained by performing nitrification process by plasma nitrification etc. onto wiring of a state of FIG. 20A.

Figure 20E:
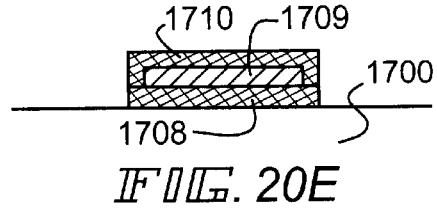

FIG. 20E is an example in which a wiring 1709 comprising a material having tungsten as a main component, formed on a film having an insulating surface (or a substrate) 1700, is wrapped by a tungsten nitride film 1710 and 1708. This structure is the same as the one shown in embodiment 3 in its form. Note that a structure of FIG. 20E is obtained by performing nitrification process by plasma nitrification etc. onto wiring of a state of FIG. 20B.

Figure 20F:
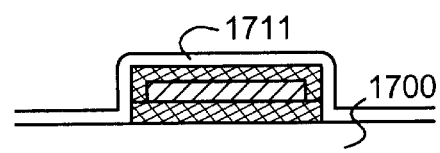

FIG. 20F is an example in which the state of FIG. 20E is covered by an insulating film 1711. The insulating film 1711 may be a silicon nitride film, a silicon oxide film, an oxidized silicon nitride film or a laminate combining these films.

Thus, the present invention can be applied onto various wiring structures. Note that the structure of embodiment 23 can freely be combined with structures shown in embodiment 1 to 22.

[Embodiment 24]

A case of applying the present invention to a reflection type liquid crystal display device manufactured on a silicon substrate is explained in embodiment 24. A TFT structure may be realized by doping an impurity element that imparts n-type or p-type conductivity directly into the silicon substrate (silicon wafer) in embodiment 24, instead of into the active layer formed of the crystalline silicon film as in embodiment 1. Furthermore, as a reflection type, a metallic film with a high reflectivity (such as aluminum, silver, or an alloy of these: an Al—Ag alloy) may be used as a pixel electrode.

Namely, a structure having the following structure: at least a pixel matrix circuit and a driver circuit are formed on the same substrate, in which: at least a portion of, or all of, an LDD region of an n-channel TFT forming the driver circuit is arranged so as to overlap a gate wiring of the n-channel TFT; an LDD region of a pixel TFT forming the pixel matrix circuit is arranged so as not to overlap a gate wiring of the pixel TFT; and an n-type conductivity imparting impurity element is contained in the LDD region of the n-channel TFT forming the driver circuit at a higher concentration than in the LDD region of the pixel TFT.

Note that it is possible to freely combine the structure of embodiment 24 with the structure of any of embodiments 1 to 23.

[Embodiment 25]

It is possible to use the present invention when forming an interlayer insulating film on a conventional MOSFET, and then forming a TFT on that. In other words, it is possible to realize a semiconductor device with a three dimensional structure. Further, it is possible to use an SOI substrate such as SIMOX, Smart-Cut (a trademark of SOITEC corporation), or ELTRAN (a trademark of Cannon, Inc.)

Note that it is possible to freely combine the structure of embodiment 25 with the structure of any of embodiments 1 to 24.

[Embodiment 26]

It is possible to apply the present invention to an active matrix type EL display. An example of this is shown in FIG. 21.

Figure 21:
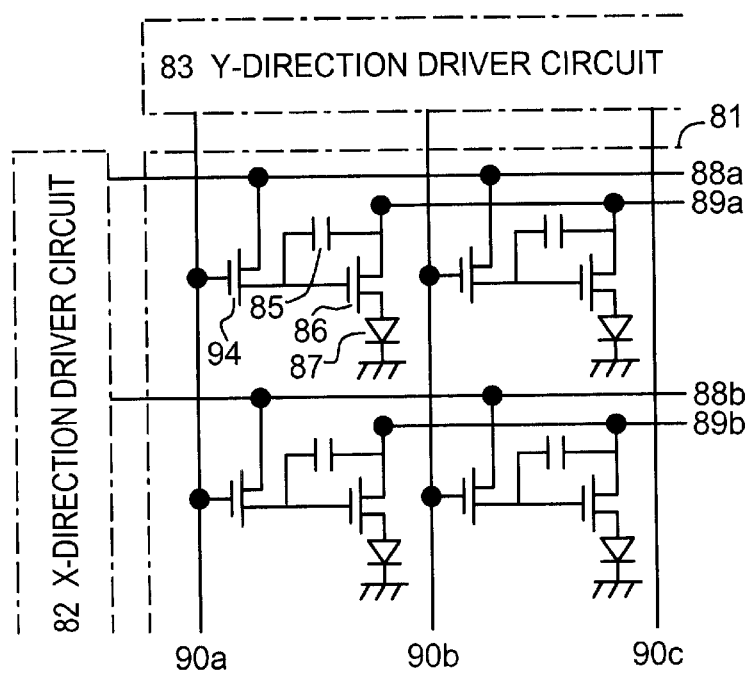
FIG. 21 is a diagram showing a structure of active matrix EL display device.

FIG. 21 is a circuit diagram of an active matrix type EL display. Reference numeral 81 denotes a display region, and an x-direction driver circuit 82 and a y-direction driver circuit 83 are formed in surrounding area. Further, each pixel in the display region 81 has switching TFT 84, a storage capacitor 85, a current controlling TFT 86, and an organic EL element 87, and the switching TFT 84 is connected to x-direction signal lines 88a (or 88b) and to y-direction signal lines 89a (or 89b, 89c). Furthermore, power supply lines 90a and 90b are connected to the current controlling TFT 86.

In an active matrix EL display of the embodiment 26, TFTs used in an x-direction driver circuit 82 and a y-direction driver circuit 83 are formed by combining p-channel TFT 301 and n-channel TFT 302 or 303 of FIG. 4A. The TFTs for switching TFT 84 and a current controlling TFT 86 are formed by n-channel TFT 304 of FIG. 4A.

[Embodiment 27]

It is possible to use a variety of liquid crystal materials in a liquid crystal display device manufactured in accordance with the present invention. The following can be given as examples of the such materials: a TN liquid crystal; PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; and in U.S. Pat. No. 5,594,569 can be used.

In particular, if an antiferroelectric liquid crystal material with no threshold value (thresholdless antiferroelectric LCD: abbreviated TL-AFLC) is used, then there are cases where power supply voltage is on the order of 5 to 8 V because the liquid crystal operating voltage may be reduced to approximately ±2.5 V. Namely, it becomes possible to operate a driver circuit and a pixel matrix circuit at the same power supply voltage, and the entire liquid crystal display device can be made low power consumption.

Further, ferroelectric liquid crystals and anti-ferroelectric liquid crystals possess an advantage in that they have a high response time compared to TN liquid crystals. It is possible to realize an extremely fast operating speed TFT for a crystalline TFT such as one used by the above embodiment, and therefore it is possible to realize a liquid crystal display device with fast image response speed by sufficiently utilizing the fast response speed of ferroelectric liquid crystals and antiferroelectric liquid crystals.

Note that the liquid crystal display device of embodiment 27 is of course effective when used as an image display of electronic equipment such as a personal computer.

Further, it is possible to freely combine the structure of embodiment 27 with the structure of any of embodiments 1 to 25.

[Embodiment 28]

CMOS circuits and pixel section formed in accordance with the present invention can be used in various electrooptical devices (active matrix type liquid crystal display, active matrix type EL display, active matrix type EC display). In other words, the present invention can be applied to all of the electronic devices having these electrooptical devices as the display section.

The following can be given as examples of this type of electronic devices: video cameras; digital cameras; projectors (rear type or front type); head mounted displays (goggle type display); car navigation systems; car stereo; personal computers; portable information terminals (such as mobile computers, portable telephones and electronic notebook). Some examples of these are shown in FIGS. 22A to 22F, 26A to 26D and 27A to 27C.

Figure 22A:
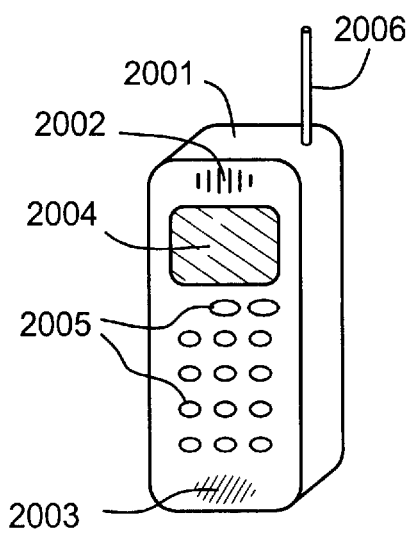
FIG. 22 is a diagram showing examples of an electronic device.

FIG. 22A is a personal computer, and comprises a main body 2001 an image input section 2002, a display device 2003, and a keyboard 2404. The present invention may be applied to the image input section 2002, display device 2003 or other signal control circuits.

Figure 22B:
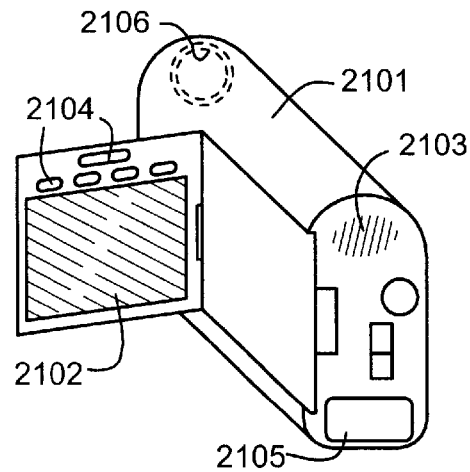

FIG. 22B is a video camera, and comprises a main body 2101, a display device 2102, a voice input section 2103, operation switches 2104, a battery 2105, and an image receiving section 2106 etc. The present invention can be applied to the display device 2102 and other signal control circuits.

Figure 22C:
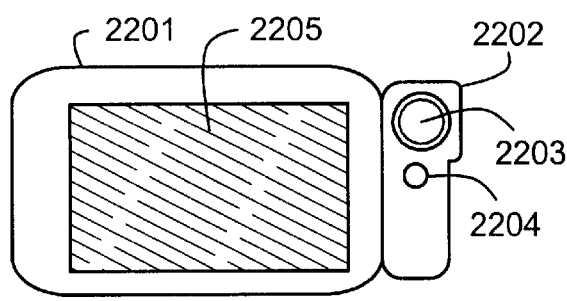

FIG. 22C is a mobile computer, and comprises a main body 2201, a camera section 2202, an image receiving section 2203, operation switches 2204, and a display device 2205 etc. The present invention can be applied to the display device 2205 and other signal control circuits.

Figure 22D:
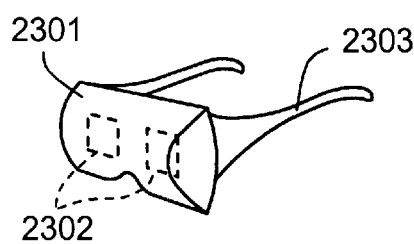

FIG. 22D is a goggle type display, and comprises a main body 2301, display devices 2302, and arm sections 2303 etc. The present invention can be applied to the display device 2302 and other signal control circuits.

Figure 22E:
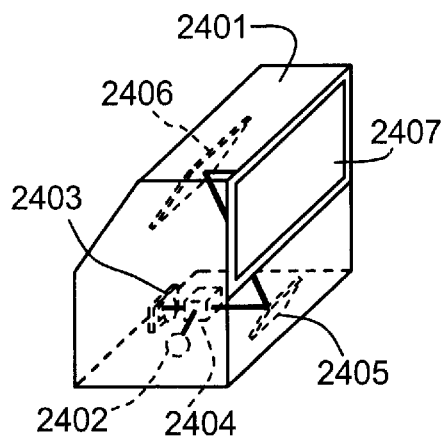

FIG. 22E is a player that uses a recording medium on which a program is recorded (hereinafter referred to as a recording medium), and comprises a main body 2401, a display device 2402, a speaker section 2403 a recording medium 2404, and operation switches 2405 etc. Note that music appreciation, film appreciation, games, and the use of the Internet can be performed with this device using a DVD (digital versatile disk), a CD, etc. as a recording medium. The present invention can be applied to the display device 2402, and to other signal control circuits.

Figure 22F:
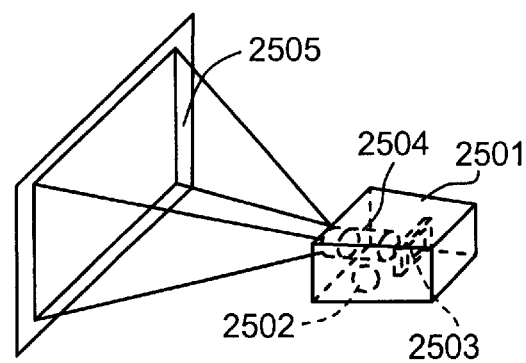

FIG. 22F is a digital camera, and comprises a main body 2501, a display device 25 02, a viewfinder 2503, operation switches 2504, and an image receiving section (not shown in the figure). The present invention can be applied to the display device 2502 and to other signal control circuits.

Figure 26A:
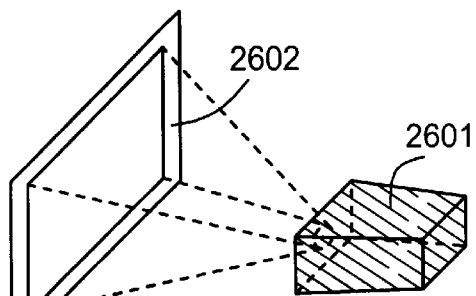
FIG. 26 is a diagram showing examples of an electronic device.

FIG. 26A is a front type projector, and comprises a projector device 2601 and a screen 2602 etc. The present invention can be applied to the liquid crystal display device 2808 that structures a section of the projector device 2601 and to other signal control circuits.

Figure 26B:
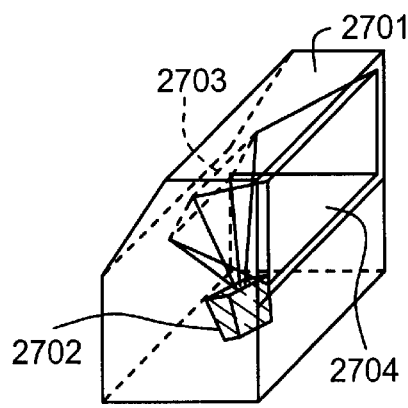

FIG. 26B is a rear type projector, and comprises a main body 2701, a projector device 2702, a mirror 2703 and screen 2704 etc. The present invention can be applied to the liquid crystal display device 2808 that comprises a section of the projector device 2702 and other signal control circuits.

Figure 26C:
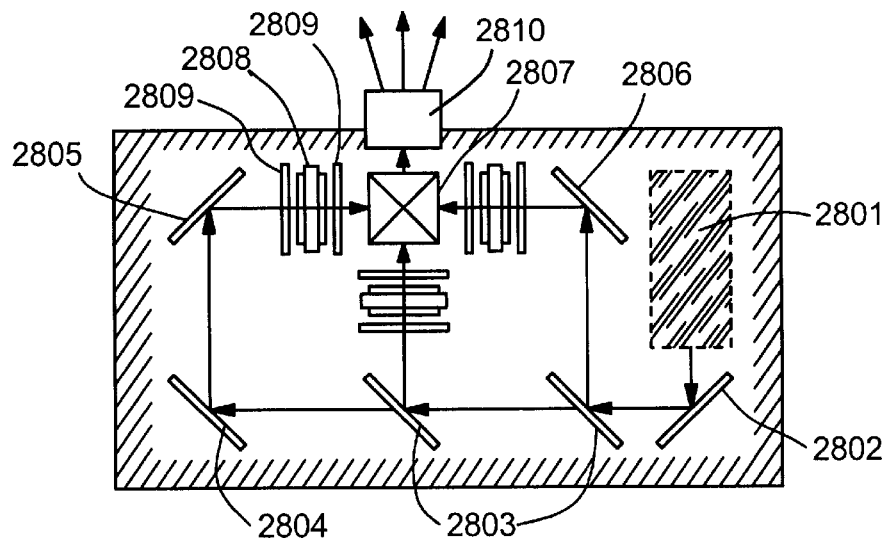

Note that FIG. 26C is a drawing showing one example of the structure of the projector devices 2601 and 2702 from FIGS. 26A and 26B. The projector devices 2601 and 2702 comprises an optical light source system 2801, mirrors 2802 and 2804 to 2806, dichroic mirror 2803, a prism 2807, a liquid crystal display device 2808, phase differentiating plate 2809 and an optical projection system 2810. The optical projection system 2810 is composed of an optical system provided with a projection lens. Embodiment 28 shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 26C.

Figure 26D:
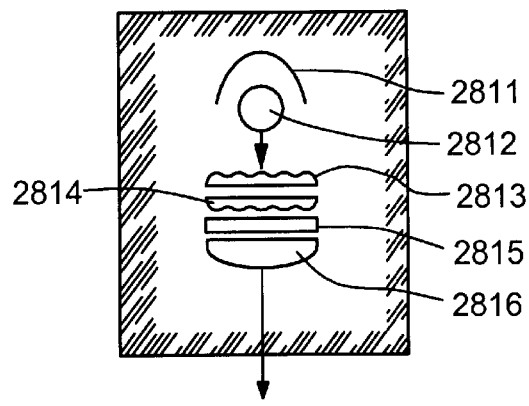

In addition, FIG. 26D shows one example of the structure of the optical light source system 2801 from FIG. 26C. In embodiment 28, the optical light source system 2801 comprises a reflector 2811, light source 2812, lens arrays 2813 and 2814, a polarizing conversion element 2815 and a condensing lens 2816. Note that the optical light source shown in FIG. 26D is merely an example and is not specifically limited to this structure. For example, the operator may suitably place optical lenses, film having polarizing function, film to regulate the phase difference, IR films, etc.

Note that the projector shown in FIGS. 26A to 26D show the case when a transmission type electrooptical device is used, and application example of reflection type electrooptical device and EL display device are not shown.

Figure 27A:
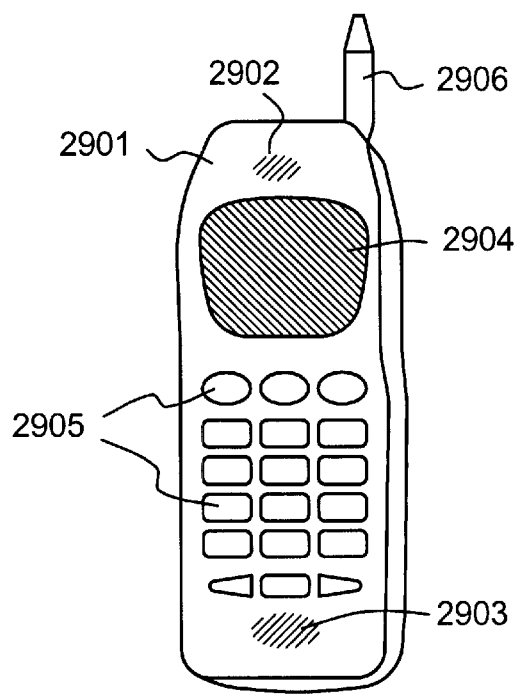
FIG. 27 is a diagram showing examples of an electronic device.

FIG. 27A is a portable telephone, and comprises a main body 2901, a voice output section 2902, a voice input section 2903, a display device 2904, operation switches 2905, and an antenna 2906 etc. The present invention can be applied to the voice output section 2902, to the voice input section 2903, to the display device 2904, and to other signal control circuits.

Figure 27B:
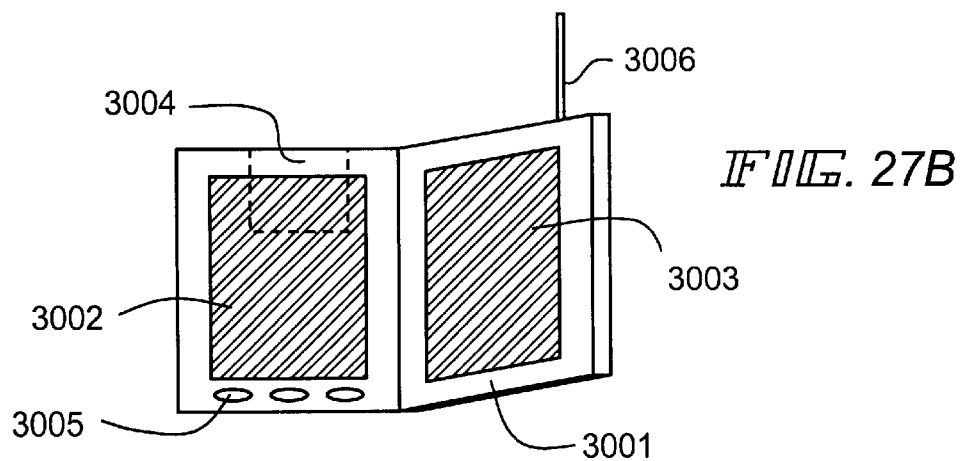

FIG. 27B is a portable book (electronic book), and comprises a main body 3001, display devices 3002 and 3003, a recording medium 3004, operation switch 3005, and an antenna 3006, etc. The present invention can be applied to the display devices 3002 and 3003 and to other signal control circuits.

Figure 27C:
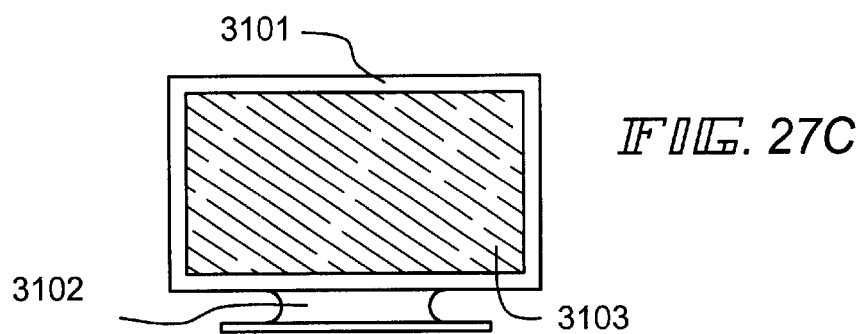

FIG. 27C is a display, and comprises a main body 3101, supporting section 3102, display device 3103. The present invention can be applied to the display device 3103. The display of the present invention is specifically advantageous in large sized display, and it is advantageous in a display over diagonal 10 inch (specifically over 30 inch).

As shown above, the applicable range of the present invention is extremely wide, and it is possible to apply the present invention to electronic equipment in all fields. Further, an electronic device of the present invention can be realized by using structure of any combination of embodiments 1 to 27.

By using the present invention, a good wiring having low electric resistivity and low stress in which oxygen amount contained in the wiring material is 30 ppm or lower, can be formed.

Further, by forming tungsten nitride on the surface of a wiring having tungsten as its main component, a wiring having low resistivity and high reliability can be obtained, and operation performance and reliability of semiconductor devices (here electrooptical devices, in concrete) can be greatly improved.

What is claimed is:

1. A wiring comprising tungsten as its main component, wherein the wiring contains oxygen in 30 parts per million or less, and argon.

2. A wiring according to claim 1 wherein electric resistivity of the wiring is 40 $\mu\Omega$·cm or less.

3. A semiconductor device having a wiring comprising tungsten as its main component, wherein the wiring contains oxygen in 30 parts per million or less, and argon.

4. A semiconductor device according to claim 3 wherein electric resistivity of the wiring is 40 $\mu\Omega$·cm or less.

5. A semiconductor device having a wiring, the wiring comprising:
a first conductive film comprising tungsten on an insulating surface; and
a second conductive film comprising tungsten nitride in contact with the first conductive film,
wherein the wiring contains argon, and contains oxygen at 30 parts per million or less.

6. A semiconductor device according to claim 5 wherein stress of the first conductive film is $-5\times10^9$ or over, and $5\times10^9$ dyn/cm$^2$ or less.

7. A semiconductor device according to claim 5 wherein a width of the wiring is 5 $\mu$m or less.

8. A semiconductor device according to claim 5 wherein a thickness of the wiring is 0.1 to 0.7 $\mu$m.

9. A semiconductor device according to claim 5 wherein the wiring is used as a gate wiring of a TFT.

10. A semiconductor device according to claim 5 wherein the semiconductor device has a display device selected from the group consisting of an active matrix liquid crystal display, an active matrix EL display and an active matrix EC display.

11. A semiconductor device according to claim 5 wherein the semiconductor device is one selected from the group consisting of: video camera, digital camera, projector, goggle type display, car navigation system, a personal computer and a portable information terminal.

12. A semiconductor device having a wiring on an insulating surface, the wiring comprising:
a first conductive film comprising tungsten nitride;
a second conductive film comprising tungsten;
a third conductive film comprising tungsten nitride on a surface of the first conductive film,
wherein the wiring contains argon, and contains oxygen at 30 parts per million or less.

13. A semiconductor device according to claim 12 wherein stress of the tungsten film is $-5\times10^9$ or over, and $5\times10^9$ dyn/cm$^2$ or less.

14. A semiconductor device according to claim 12 wherein a width of the wiring is 5 $\mu$m or less.

15. A semiconductor device according to claim 12 wherein a thickness of the wiring is 0.1 to 0.7 $\mu$m.

16. A semiconductor device according to claim 12 wherein the wiring is used as a gate wiring of a TFT.

17. A semiconductor device according to claim 12 wherein the semiconductor device has a display device selected from the group consisting of an active matrix liquid crystal display, an active matrix EL display and an active matrix EC display.

18. A semiconductor device according to claim 12 wherein the semiconductor device is one selected from the group consisting of: video camera, digital camera, projector, goggle type display, car navigation system, a personal computer and a portable information terminal.

19. A semiconductor device comprising:
at least one TFT over a substrate; and
at least one wiring connected with the TFT over the substrate,
wherein the wiring comprises tungsten, oxygen in 30 parts per million or less, and argon.

20. A semiconductor device according to claim 19 wherein electric resistivity of the wiring is 40 $\mu\Omega$·cm or less.

21. A semiconductor device according to claim 19 wherein the wiring is used as a gate wiring of the TFT.

22. A semiconductor device according to claim 19 wherein the wiring is used as a source wiring of the TFT.

23. A semiconductor device according to claim 19 wherein the wiring is used as a drain wiring of the TFT.

24. A semiconductor device according to claim 19 wherein an active layer of the TFT has at least one LDD region.

25. A semiconductor device according to claim 19 wherein the semiconductor device comprises a display device selected from the group consisting of an active matrix liquid crystal display, an active matrix EL display, and an active matrix EC display.

26. A semiconductor device according to claim 19 wherein the semiconductor device is one selected from the group consisting of: video camera, digital camera, projector, goggle type display, car navigation system, a personal computer and a portable information terminal.

27. A semiconductor device comprising:

at least one TFT over a substrate; and at least one wiring connected with the TFT over the substrate, wherein the wiring comprises a first conductive film comprising tungsten and a second conductive film comprising tungsten nitride, and wherein the wiring includes argon and oxygen in 30 parts per million or less.

28. A semiconductor device according to claim 27 wherein the wiring comprises first, second, and third films and wherein the first and third films comprise tungsten nitride and the second film comprises tungsten.

29. A semiconductor device according to claim 27 wherein stress of the first conductive film is $-5\times10^9$ or over, and $5\times10^9$ dyn/cm$^2$ or less.

30. A semiconductor device according to claim 27 wherein a width of the wiring is 5 µm or less.

31. A semiconductor device according to claim 27 wherein a thickness of the wiring is 0.1 to 0.7 µm.

32. A semiconductor device according to claim 27 wherein the wiring is used as a gate wiring of the TFT.

33. A semiconductor device according to claim 27 wherein the wiring is used as a source wiring of the TFT.

34. A semiconductor device according to claim 27 wherein the wiring is used as a drain wiring of the TFT.

35. A semiconductor device according to claim 27 wherein an active layer of the TFT has at least one LDD region.

36. A semiconductor device according to claim 27 wherein the semiconductor device comprises a display device selected from the group consisting of an active matrix liquid crystal display, an active matrix EL display, and an active matrix EC display.

37. A semiconductor device according to claim 27 wherein the semiconductor device is one selected from the group consisting of: video camera, digital camera, projector, goggle type display, car navigation system, a personal computer and a portable information terminal.

* * * * *